(12) United States Patent
Liu et al.

(10) Patent No.: US 12,068,054 B2
(45) Date of Patent: Aug. 20, 2024

(54) SRAM DESIGN FOR ENERGY EFFICIENT SEQUENTIAL ACCESS

(71) Applicant: Meta Platforms Technologies, LLC, Menlo Park, CA (US)

(72) Inventors: Huichu Liu, Santa Clara, CA (US); Daniel Henry Morris, Mountain View, CA (US); Edith Dallard, San Mateo, CA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 128 days.

(21) Appl. No.: 17/737,820

(22) Filed: May 5, 2022

(65) Prior Publication Data

US 2023/0075959 A1    Mar. 9, 2023

Related U.S. Application Data

(60) Provisional application No. 63/240,816, filed on Sep. 3, 2021.

(51) Int. Cl.
*G11C 8/00* (2006.01)
*G11C 7/10* (2006.01)
(Continued)

(52) U.S. Cl.
CPC .......... *G11C 7/1093* (2013.01); *G11C 7/1048* (2013.01); *G11C 7/1066* (2013.01);
(Continued)

(58) Field of Classification Search
CPC ... G11C 7/1093; G11C 7/1048; G11C 7/1066; G11C 7/12; G11C 8/08; G11C 8/18
See application file for complete search history.

(56) References Cited

U.S. PATENT DOCUMENTS

2004/0081009 A1\* 4/2004 Mangyo .............. G11C 11/4097
  365/203
2011/0191548 A1   8/2011 Miller et al.
(Continued)

OTHER PUBLICATIONS

International Search report and Written Opinion for International Application No. PCT/US2022/042466, mailed Nov. 28, 2022, 11 pages.

*Primary Examiner* — Min Huang
(74) *Attorney, Agent, or Firm* — Weaver Austin Villeneuve & Sampson LLP

(57) ABSTRACT

An SRAM controller for performing sequential accesses using internal ports that operate concurrently on different rows. Each internal port includes a row address strobe (RAS) timer that generates clock signals controlling the timing of operations during a RAS phase in which word line decoding is performed once for a group of bit cells being accessed. The RAS phase can involve additional conditioning operations, such as precharging of local bits lines associated with the group of bit cells. The RAS phase is followed by an input/output (IO) phase in which individual bit cells are accessed in sequential address order using a column select signal generated by an IO timer. The RAS phase of a first internal port can be at least partially overlapped by the IO phase of a second internal port to hide the RAS latency of the first internal port. The IO timer can be shared among internal ports.

20 Claims, 22 Drawing Sheets

(51) Int. Cl.
*G11C 7/12* (2006.01)
*G11C 8/08* (2006.01)
*G11C 8/18* (2006.01)

(52) U.S. Cl.
CPC .................. *G11C 7/12* (2013.01); *G11C 8/08* (2013.01); *G11C 8/18* (2013.01)

(56) References Cited

U.S. PATENT DOCUMENTS

| | | | |
|---|---|---|---|
| 2016/0163379 A1* | 6/2016 | Roine | G11C 7/1039 |
| | | | 365/154 |
| 2018/0151221 A1 | 5/2018 | Chen et al. | |
| 2020/0020388 A1 | 1/2020 | Arsovski et al. | |
| 2021/0019048 A1* | 1/2021 | Lea | G06F 3/0689 |
| 2021/0391000 A1* | 12/2021 | Lee | G11C 11/4091 |

* cited by examiner

SRAM DESIGN FOR ENERGY EFFICIENT SEQUENTIAL ACCESS

CROSS-REFERENCE TO RELATED APPLICATIONS

This application claims priority under 35 U.S.C. § 119 to U.S. Provisional Patent Application No. 63/240,816, filed on Sep. 3, 2021, the contents of which are hereby incorporated by reference in their entirety for all purposes.

BACKGROUND

Static Random Access Memory (SRAM) is an important building block of the memory system in processors (e.g., central processing units (CPUs) and graphics processing units (GPUs)), neural network accelerators, and system-on-chip (SOC). SRAM and other RAM devices are often designed for optimal performance under the assumption that actual usage will involve random access (reads and writes). However, the data access in some computing applications is not random but instead follows a predictable access pattern. Moreover, the data transfer to and from memory often uses "burst mode" access, which involves sequentially accessing addresses across an address range. The starting address, stride, and the number of accesses (burst length) are provided by the requestor device (e.g., a processing unit).

Augmented reality (AR) devices may access sequential memory addresses in connection with generating output for display to a user (e.g., via a head mounted display). The sequential memory addresses can include one or more ranges of addresses that are stepped through in increasing or decreasing order. For instance, an AR device may write image data to addresses 0 to 900 of a display buffer during a first access cycle and overwrite the data in addresses 0 to 900 during a subsequent access cycle. Sequential access can also occur when accessing a memory storing data for a neural network (e.g., weight values and/or activation values). Conventional sequential SRAM access, e.g., using a traditional memory controller, is less energy efficient because energy is wasted in conditioning the rows and columns of the memory array with each read or write operation, regardless of the access pattern. Conditioning may involve, for example, precharging bit lines (BLs), decoding addresses, and/or driving a wordline (WL) corresponding to a row. In addition, conditioning is time-constrained to being completed within a single clock cycle, limiting the SRAM's operating frequency.

SUMMARY

The present disclosure generally relates to techniques for optimizing sequential accesses to SRAM. In particular, embodiments are described which relate to an SRAM controller configured to perform sequential accesses to one or more SRAM devices in an energy efficient manner through implementing a two-phase access involving a row address strobe (RAS) phase followed by an input/output (IO) phase, parallel access operations using an internal multi-port (e.g., dual port) architecture, precharging of bit lines associated with the same global column or global column range, and other techniques. Additionally, the SRAM controller can be programmable to set the timing with which various control signals are generated in order to support a variety of applications and/or SRAM designs, allowing the SRAM controller to meet the performance requirements of different operating environments.

In certain aspects, an SRAM system is configured with multiple internal ports, each port configured to perform RAS operations on a respective input address. In particular, each port may be configured according to the two-phase operation (RAS followed by TO), with the RAS phase of a first port overlapping with the IO phase of a second port such that the RAS latency of the first port is hidden.

In certain aspects, an SRAM system includes configurable clock signal generation elements that enable the timing of clock signal pulses to be adapted to different operating characteristics (e.g., operating voltage or frequency) and/or performance targets. For example, the SRAM system can be switched between RAS modes that differ with respect to the total number of clock cycles taken to perform RAS operations (e.g., decoding, precharge, equalization, word line driving) for a given input address.

Example SRAM controller: In certain aspects, an SRAM controller includes first control logic, a first RAS timer, and an IO timer. The first control logic is configured to generate a first plurality of control signals for output to an SRAM device. The first plurality of control signals causes a first group of bit cells in the SRAM device to be accessed in sequential address order. The first plurality of control signals includes a first precharge signal and a first column select signal. The first RAS timer is configured to generate a clock signal controlling a timing of the first precharge signal. The first precharge signal triggers a precharge operation during a first RAS phase in which a word line decoding operation is performed once for all bit cells in the first group of bit cells. The IO timer is configured to generate a clock signal controlling a timing of the first column select signal. The first column select signal is updated multiple times during a first IO phase that follows the first RAS phase, each update to the first column select signal causing a different bit cell in the first group of bit cells to be selected.

In certain aspects, the SRAM device receiving the first plurality of control signals generated by the above-described SRAM controller includes a plurality of bit cell arrays. Each bit cell array of the plurality of bit cell arrays includes bit cells arranged into a plurality of rows and a plurality of columns, each row is associated with a corresponding word line, and each column is associated with a corresponding pair of local bit lines. Local bit lines within a bit cell array are grouped into global columns. Each bit cell in the first group of bit cells belongs to a same global column or global column range (e.g., a group of global columns that span an entire row), and the precharge operation involves precharging local bit lines of all bit cells in the first group of bit cells.

In certain aspects, the above-described SRAM controller further includes second control logic and a second RAS timer. The second control logic is configured to generate a second plurality of control signals for output to the SRAM device. The second plurality of control signals causes a second group of bit cells in the SRAM device to be accessed in sequential address order. The second plurality of control signals includes a second precharge signal and a second column select signal. The second RAS timer is configured to generate a clock signal controlling a timing of the second precharge signal. The second precharge signal triggers a precharge operation during a second RAS phase in which a word line decoding operation is performed once for all bit cells in the second group of bit cells. The first control logic and the first RAS timer are associated with a first internal port of the SRAM controller. The second control logic and the second RAS timer are associated with a second internal port of the SRAM controller. The IO timer can be shared by the first internal port and the second internal port. The bit cells in the second group of bit cells can be accessed in sequential address order during a second IO phase that follows the second RAS phase, with the second RAS phase being at least partially overlapped by the first IO phase. The second group of bit cells can belong to a different bit cell array than the first group of bit cells. Further, the SRAM controller can include a shared data bus onto which read or write data is communicated during the first IO phase and the second IO phase.

In some aspects, a RAS timer and/or the IO timer of the above-described SRAM controller includes configurable delay elements. For example, the first RAS timer can include configurable delay elements that control a relative timing between two or more clock signals generated by the first RAS timer, the two or more clock signals generated by the first RAS timer including the clock signal controlling the timing of the first precharge signal. Alternatively or additionally, the IO timer can include configurable delay elements that control a relative timing between two or more clock signals generated by the IO timer, the two or more clock signals generated by the IO timer including the clock signal controlling the timing of the first column select signal. The two or more clock signals generated by the first RAS timer or the two or more clock signals generated by the IO timer can be triggered in sequence based on a single pulse in an input clock of the SRAM controller.

In some aspects, a RAS timer of the above-described SRAM controller is configurable such that a duration of a RAS phase can be set to more than one cycle of an input clock to the SRAM controller. For instance, the first RAS timer can be configured to set the first RAS phase to one clock cycle, two clock cycles, three clock cycles, etc.

In some aspects, the above-described SRAM controller and the SRAM device form a system configured to process memory requests sent from a computing device. The SRAM controller can include an interface that communicatively couples the SRAM controller to the computing device and an interface that communicatively couples the SRAM controller to the SRAM device. Optionally, the interface that communicatively couples the SRAM controller to the computing device can expose a single port to the computing device, so that the computing device is unaware that multiple internal ports of the SRAM controller are being used to fulfill the memory requests.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Several illustrative embodiments will now be described with respect to the accompanying drawings, which form a part hereof. While particular embodiments, in which one or more aspects of the disclosure may be implemented, are described below, other embodiments may be used and various modifications may be made without departing from the scope of the disclosure. Embodiments described herein provide for an SRAM architecture that incorporates various inventive features designed to improve energy efficiency during sequential accesses. Aspects of different embodiments may be combined.

An SRAM device includes a bit cell array arranged as a set of rows and a set of columns. Columns may be arranged into column groups, where each column group includes a set of local columns. Each bit cell may be connected to a bit line pair (generally referred to herein as BL and BLB). Each row may be connected to a word line. When accessing (whether as part of a read operation or as part of a write operation) a particular bit cell of the array, a row decoder is provided a row address, and the row decoder may be configured to activate (e.g., assert) the word line corresponding to the row address. During an operation, a column decoder associated with a particular column group may be configured to select, using a column multiplexer, a particular local column within the column group. The column multiplexer may select the pair of local bit lines, which are then connected to a data line pair in order to perform an operation. For example, in a read operation, a read circuit (e.g., a sense amplifier) may sense the voltage on the bit line pair, which may then be transmitted to one or more interface circuits. As another example, in a write operation, a write circuit (e.g., a write driver) drives the pair of bit lines to store a data value in the corresponding bit cell.

Figure 1:
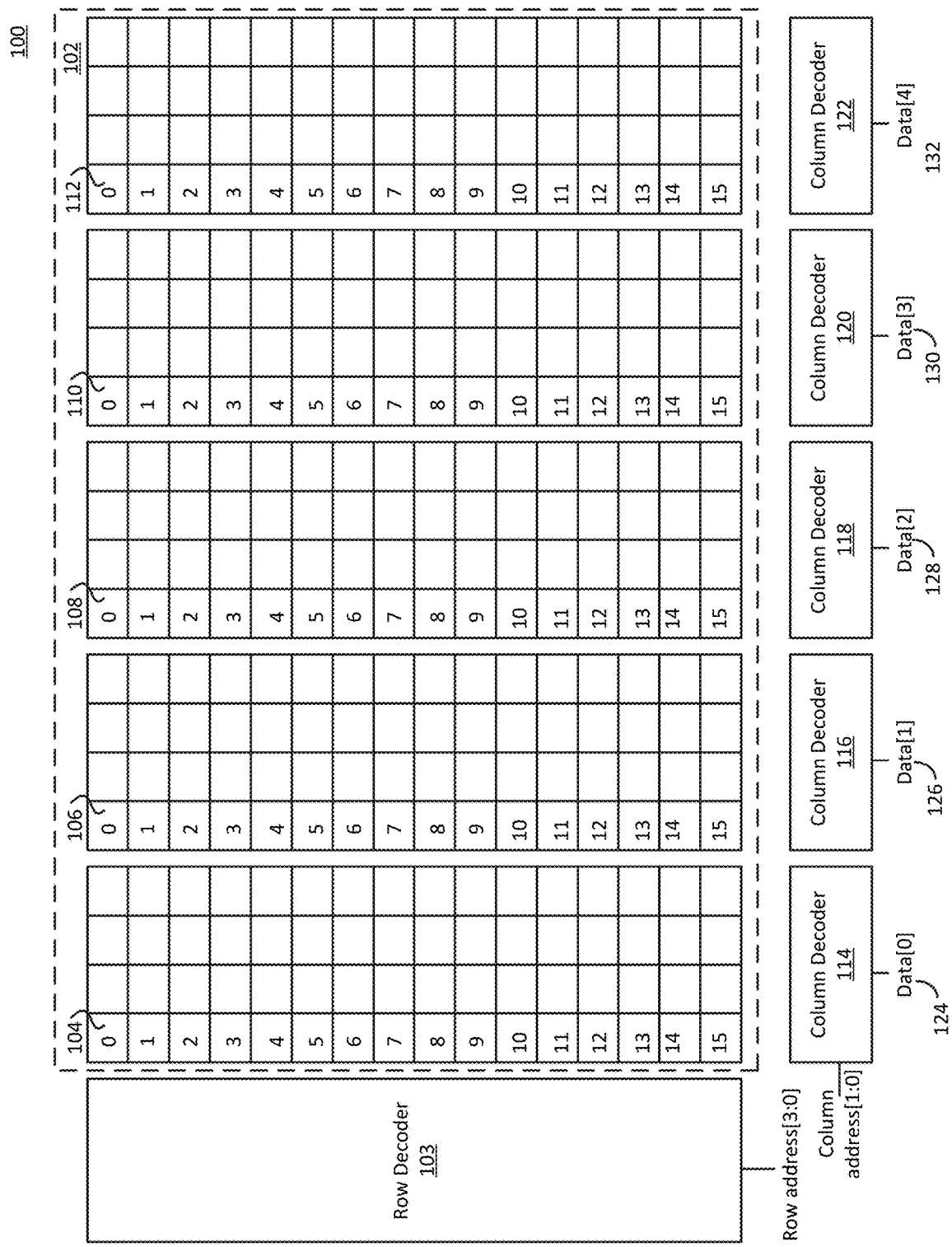
FIG. 1 shows a schematic of an SRAM device, in accordance with some embodiments.

FIG. 1 shows a schematic of an SRAM device 100, in accordance with some embodiments. As illustrated, SRAM device 100 includes a bit cell array 102 with sixteen rows. The rows of bit cell array 102 may be accessed by a row decoder 103. For example, row decoder 103 may take, as an input, a 4-bit row address that identifies a row of the sixteen rows. Bit cell array 102 additionally includes five column groups, 104, 106, 108, 110, and 112. Each column group is associated with a column decoder and may correspond to global column. For example, column group 104 is associated with column decoder 114, column group 106 is associated with column decoder 116, column group 108 is associated with column decoder 118, column group 110 is associated with column decoder 120, and column group 112 is associated with column decoder 122. Each column group of bit cell array 102 includes four local columns. Each column decoder may include a column multiplexer (not shown) that selects a particular local column of the column group. The column multiplexer may operatively couple a bit line pair of the selected local column to a data line associated with the column decoder (e.g., one of data lines 124, 126, 128, 130, or 132). For bit cell array 102 of FIG. 1, a column decoder may take, as an input, a 2-bit column address that identifies one of the four local columns.

With conventional SRAM controllers, a word line corresponding to a particular row is asserted and de-asserted within a single clock cycle to drive the word line. In other words, when multiple bit cells associated with different columns and the same row are accessed sequentially, the word line is asserted and de-asserted for each access within the same row. Each access therefore consumes power due to driving the word line. Further, each access may consume power as a result of precharging local bit lines (e.g., a BL-BLB pair in a local column being accessed) and decoding the word line corresponding to the bit cell being accessed.

In order to reduce energy consumption, an SRAM device that is the subject of sequential accesses may be controlled using an SRAM controller that is configured to perform precharging and word line decoding once for a set of sequential accesses. The precharging and word line decoding can be performed during a row address strobe (RAS) phase to open a row. The RAS phase can be performed over one or more clock cycles. Following the RAS phase, a separate IO cycle is performed for each access. In this manner, the word line can be asserted once for the entire set of sequential accesses, so that the energy used to open the row is shared across the sequential accesses. In some embodiments, additional precharging of local bit lines may optionally be performed during individual IO cycles to ensure that the last bit cell to be accessed in the set of sequential accesses has a sufficient amount of charge for a valid read or write. However, most of the energy for precharging is consumed upfront as part of the RAS phase.

In addition to using a shared RAS phase, an SRAM controller implemented according to one or more embodiments of the present disclosure may be configured to divide sequential memory accesses among a set of internal ports that operate in parallel. The internal ports can operate such that the RAS phase of a first port is at least partially overlapped by the IO phase (one or more IO cycles) of a second port. For example, the RAS phase of the first port may coincide with the final IO cycles of a set of accesses being performed through the second port. In this manner, the RAS latency of the first port can be hidden. From the perspective of a computing device sending memory requests to the SRAM controller, the memory requests may appear to be handled through a single port and with less latency compared to a conventional SRAM controller. Example embodiments of SRAM controllers are described below in reference to FIGS. 4 and 5.

Figure 2:
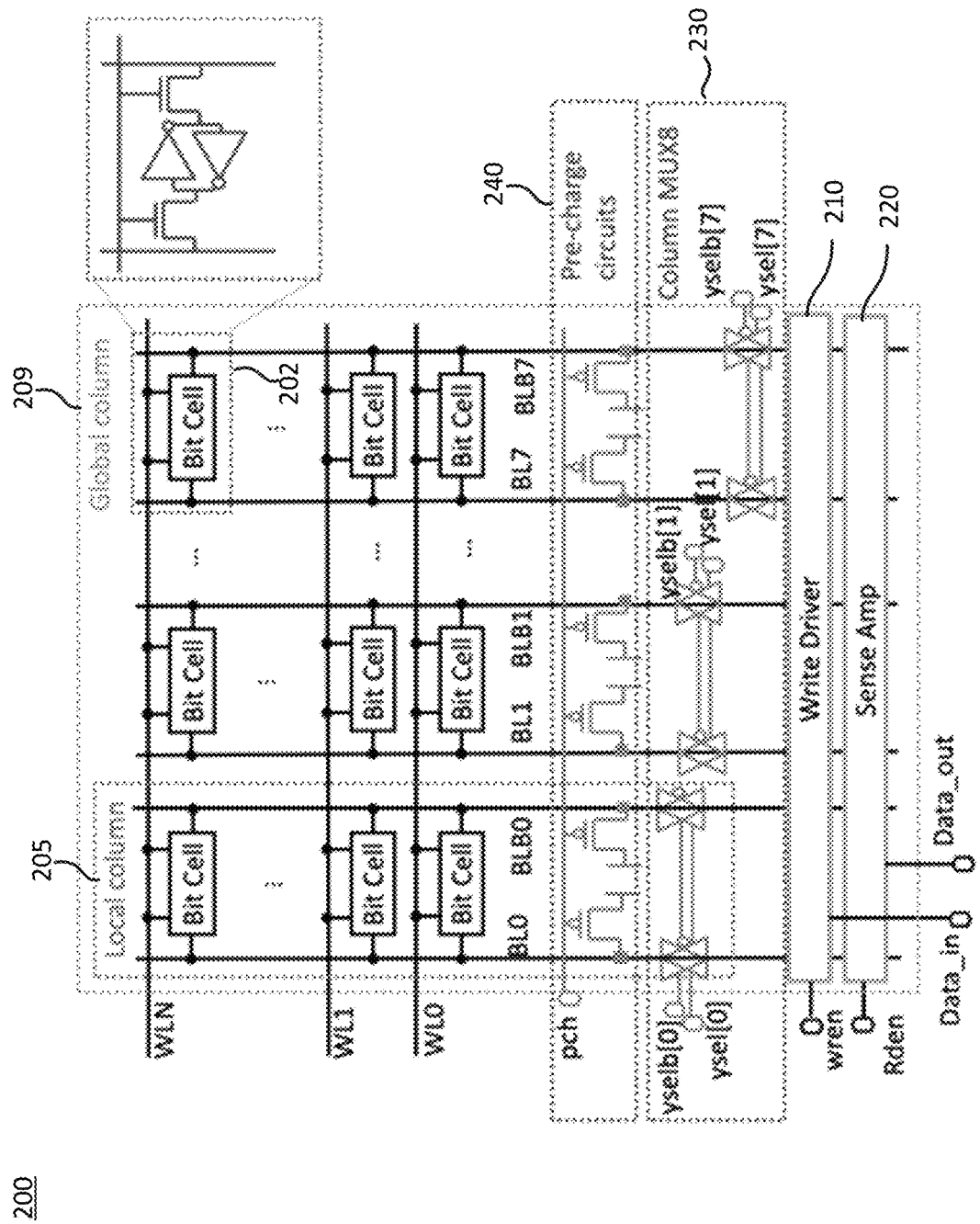
FIG. 2 shows a schematic of an SRAM device, in accordance with some embodiments.

FIG. 2 shows a schematic of an implementation of an SRAM device 200, in accordance with some embodiments. The SRAM device 200 may correspond to the SRAM device 100. Whereas FIG. 1 is provided to explain the general layout of a bit cell array and access using row and column decoders, FIG. 2 shows additional device components that can be used to perform accesses to bit cells. In FIG. 2, the bit cell array includes local columns 205 that are grouped together into a global column 209 (e.g., encompassing eight local columns, as shown). The global column 209 is coupled to a write driver 210, a sense amplifier 220, and a column multiplexer (MUX) 230. Write driver 210 and sense amplifier 220 are shared by each of the local columns 205 within the global column 209. The inset image in FIG. 2 depicts an example schematic of a bit cell 202, reproduced in FIG. 3. In general, each bit cell 202 can be implemented using a pair of pass transistors and a pair of cross-coupled inverters. However, other bit cell designs may be used.

As described above in reference to FIG. 1, a row decoder may decode a row address to access a row of the bit cell array. In FIG. 2, each row is represented as a separate word line (WL), and each column is presented by a bit line pair (BL and its complement, BLB). Further, as mentioned above, a column multiplexer can select a particular local column of the column group. Accordingly, the global column 209 may correspond to one of the column groups in FIG. 1 (e.g., one of the column groups 104, 106, 108, 110, and 112), and the column MUX 230 may correspond to a multiplexer associated with the global column 209. The column MUX 230 is controlled by a column select signal (ysel) and its complementary signal (yselb). A bit cell array can include multiple global columns that collectively form the bit lines of a row.

Write driver 210 is configured to write data received through an input data bus (Data_in) to a selected bit cell 202 when the write driver is activated by a write enable signal (wren). The write driver 210 may write to the selected bit cell by, for example, sinking current through the pass transistors that form the bit cell. The gates of the pass transistors are connected to the word line of the bit cell. When activated, a word line typically has a word line supply voltage equal to the supply voltage of the SRAM device (e.g., a voltage VDD). Word line boosting can be performed to increase the voltage on the word line above the supply voltage of the SRAM device.

Sense amplifier 220 is used during read accesses and is configured to amplify the voltage on a selected bit line to produce an output signal having a voltage corresponding to logic 1 (high) or logic 0 (low) depending on the state of the bit cell providing the voltage for the selected bit line. The voltage amplified by the sense amplifier 220 can be a differential voltage produced by a bit line pair (BL and BLB). When activated by a read enable signal (rden), the sense amplifier 220 provides its output signal to an output data bus (Data_out).

As shown in FIG. 2, the SRAM device 200 can include a set of precharge circuits 240. Each local column can have a separate precharge circuit implemented using a pair of pull-up elements (e.g., PMOS transistors). The precharge circuit can be configured to pull-up the voltages on a corresponding bit line pair. For example, during a read operation, the precharge circuit coupled to the bit pair can drive both bit lines (BL and BLB) high. Once the word line of the selected bit cell is turned on, one of the two bit lines with be pulled down by the bit cell, e.g., BL discharges to a voltage associated with logic 0 if the bit cell stores a 0. Similarly, during a write operation, the precharge circuit can drive both bit lines of the bit line pair high to precondition the bit lines. The write driver 210 can then force one of the bit lines to 0 while maintaining the precharged voltage on the other bit line. Afterwards, the word line of the selected bit cell is activated and the bit cell stores the value corresponding to the voltages on BL and BLB. Precharge can be performed to reduce delay in sourcing drive current into a bit line, thereby speeding up reads and writes.

Additionally, as described below in connection with the example of FIG. 5, an SRAM device may support additional conditioning operations including precharge to 0 and bit line equalization. Precharging to 0 discharges the voltages on a bit line pair and can be performed to reduce any residual voltage on the bit line pairs prior to precharging to 1. Accordingly, the precharge circuits 240 can include pull-down elements (e.g., NMOS transistors).

Each local column may further include an equalization circuit (not shown) configured to equalize the voltages on BL and BLB. Equalization minimizes the voltage difference between a bit line pair and can be performed prior to reading from or writing to the local column of the bit line pair so that when a value is driven onto one of the bit lines in the bit line pair (e.g., by pulling BL low), the sense amplifier 220 can more easily detect the difference between the voltages of BL and BLB.

Figure 3:
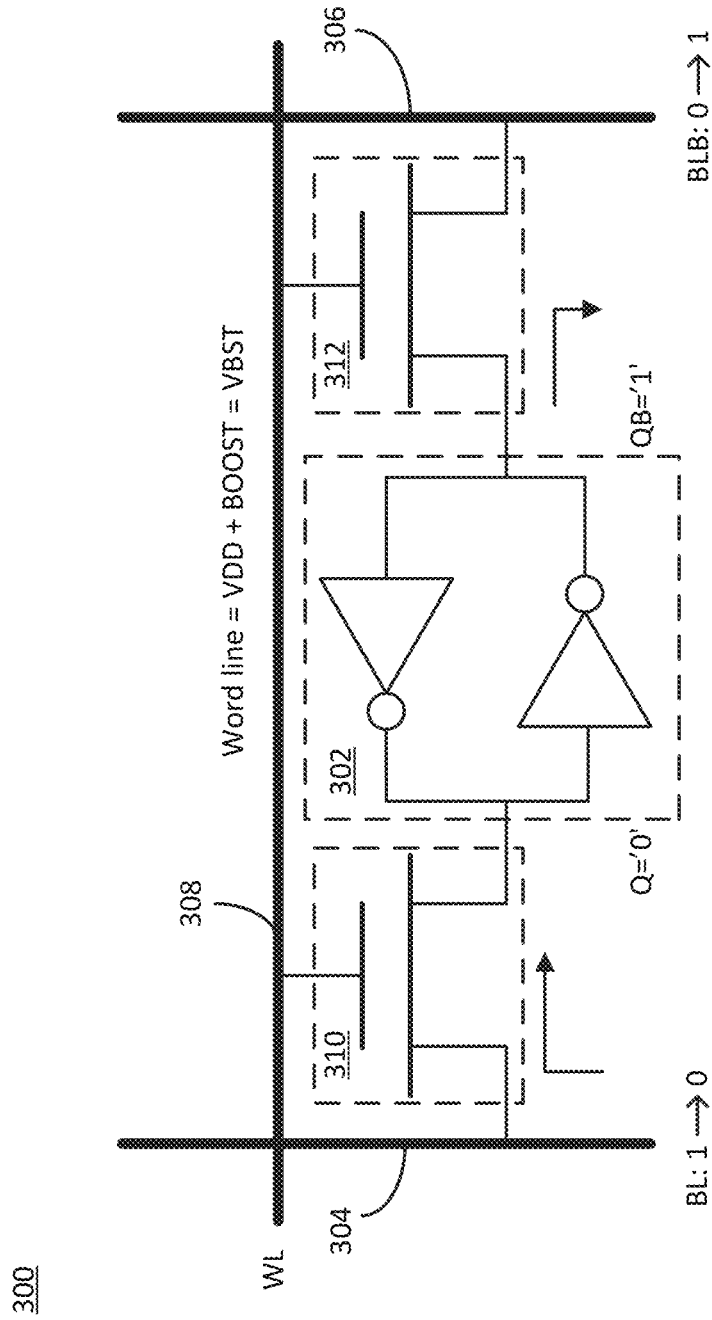
FIG. 3 shows an example of a bit cell usable for implementing an SRAM device, according to some embodiments.

FIG. 3 shows an example of a bit cell 300 usable as a bit cell (e.g., bit cell 202) in an SRAM device, according to some embodiments. The bit cell 300 includes cross-coupled inverters 302 connected to a pair of bit lines, BL 304 and BLB 306. Cross-coupled inverters 302 are also connected to a pair of pass transistors 310 and 312. The gate of each pass transistor 310, 312 is connected to a word line 308.

FIG. 3 depicts a write operation being performed on the bit cell 300. During the write operation, a drain current passes through the pass transistors 310 and 312 to drive a new value onto bit lines 304 and 306 and into the cross-coupled inverters 302. For example, the drain current may pull up BLB 306 (or keep BLB 306 at a precharged voltage) while simultaneously pulling down BL 304, as shown. Word line 208, when asserted, nominally has a voltage of VDD, corresponding to a voltage provided by a word line supply device. The voltage VDD is typically associated with the supply voltage of the SRAM controller or SRAM device. In some instances, the voltage of word line 308 may be boosted by an amount denoted in FIG. 3 as "BOOST" to increase the voltage of the word line to a voltage "VBST." Because the gate of each pass transistor is connected to word line 308, boosting the voltage of word line 208 may increase the drain current, reducing the likelihood of a write operation failure.

Word line boosting can be performed using a boost circuit with one or more elements that boost the word line voltage either directly or indirectly (e.g., through capacitive coupling). For example, the boost circuit may include a boost driver that is capacitively coupled via a boost capacitor to a word line driver associated with the word line 208. The boost driver can be a buffer configured to transfer a charge to the word line via the boost capacitor. In some implementations, the boost driver is connected to more than one boost capacitor. Additionally, a word line can be coupled to multiple boost drivers to, for example, implement a two-stage boosting operation in which the word line is brought up to an intermediate voltage before being further boosted to reach VB ST. The boost circuit may also support multiple boost levels so that the word line can be boosted to one of several voltages.

Figure 4:
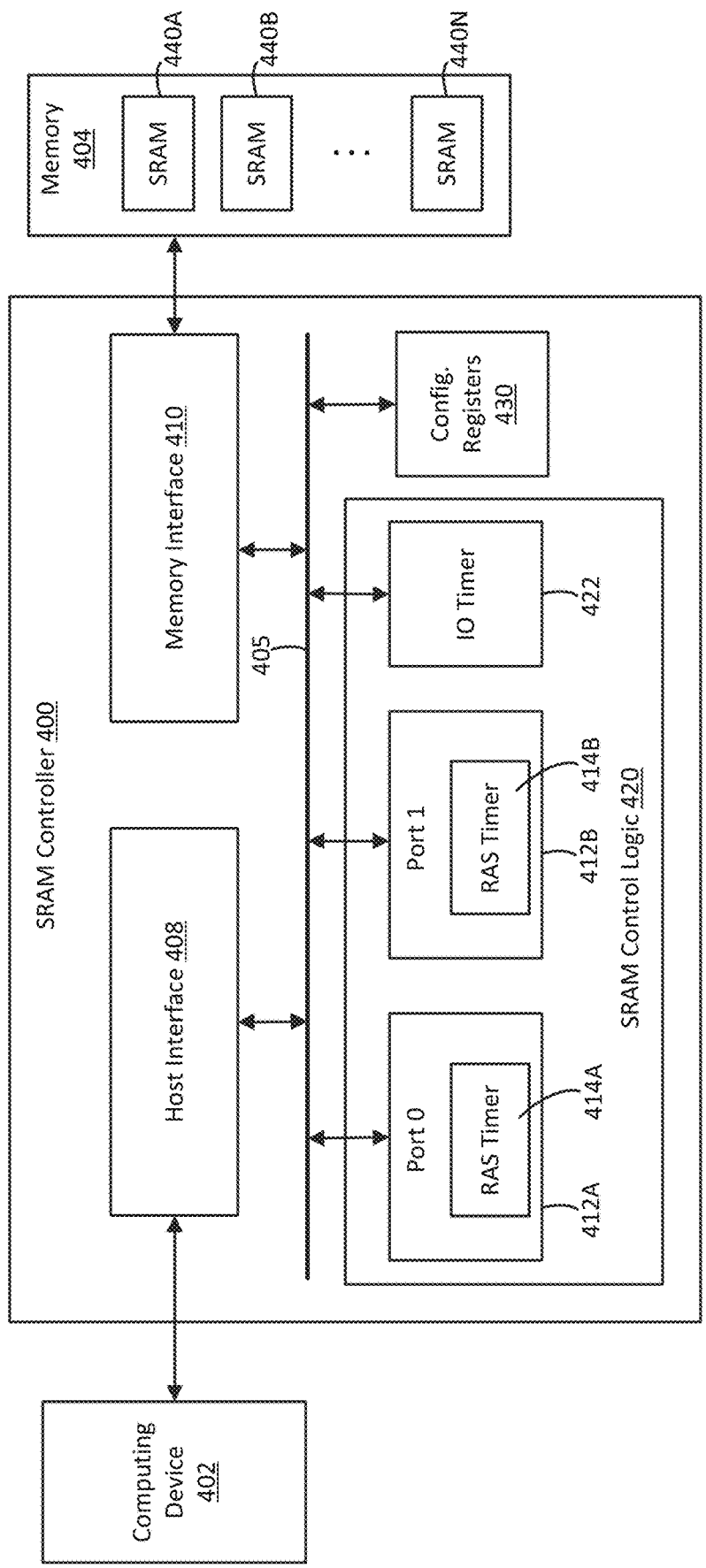
FIG. 4 shows a simplified block diagram of an SRAM controller, according to some embodiments.

FIG. 4 shows a simplified block diagram of an SRAM controller 400, according to some embodiments. The controller 400 includes a host interface 408 that is communicatively coupled to a computing device 402. The computing device 402 can be any device that is configured to generate memory requests. For example, computing device 402 can be an external computer that is connected to the controller 400 through a communications network such as a local area network. As another example, computing device 402 can be a processor (e.g., a CPU) that is connected to the controller 400 through a bus. In some implementations, computing device 402 and controller 400 may be integrated into a single device, for example, a system-on-chip.

Memory 404 can include one or more SRAM devices. For example, memory 404 may include an SRAM module that is physically and/or logically divided according to a hierarchical structure comprising multiple ranks and multiple banks within each rank, where each bank corresponds to a separate bit cell array that is divided into sub-arrays (e.g., half arrays). In some implementations, the controller 400 and the memory 404 are co-located on the same device. For example, the controller 400 and the memory 404 may form an SRAM chip. Alternatively, controller 400 can be an external controller that is separate from the memory 404. Accordingly, FIG. 4 can represent any number of computing environments, including environments where controller 400 and/or memory 404 are external to the computing device 402 and environments where controller 400 and/or memory 404 are integrated with the computing device 402.

Host interface 408 is configured to receive memory requests from the computing device 402. The host interface 408 processes the memory requests to generate input signals to control logic 420 of the controller 400. The control logic 420 generates output signals based on the input signals from the host interface 408. The output signals are output to the memory 404 through the memory interface 410 and configure the memory 404 to read or write data in accordance with the memory requests from the computing device 402.

In addition to sending the control signals generated by the control logic 420 to the memory 404, the memory interface 410 also communicates data to and from the memory 404. The data can be communicated through one or more buses 405 of the controller 400. For example, the one or more buses 405 may include a read bus and a separate write bus as well as an address bus. The one or more buses 405 may intercouple the components of the controller 400.

Controller 400 may further include one or more configuration registers 430. The configuration register(s) 430 store values for parameters used by the control logic 420 to generate output signals for the memory 404. For example, as described below, a configuration register can store the value for a parameter representing a configurable delay that determines the timing of a clock signal internal to the controller 400. The internal clock signal is used for timing control of a memory access. A memory access typically involves multiple types of timing control signals used to determine the timing of different operations (e.g., precharge, input/output, column selection, word line enable, and the like). The values of the configuration registers 430 can be factory-configured when the controller 400 is manufactured. Alternatively, the values of the configuration registers 403 may be user-configured, e.g., through commands sent from the computing device 402. Accordingly, the configuration registers 430 may be programmable.

Depending on memory design and operating requirements, the configuration registers 430 can be implemented as a single configuration register or multiple configuration registers. For example, a single configuration register can be used to drive configuration signals relating to precharging bit lines to 0, precharging bit lines to 1, and bit line equalization if the same clock duration is used for each of these operations. Alternatively, if different clock durations are needed, then one or more configuration signals can be driven using a separate configuration register.

As shown in FIG. 4, the control logic 420 can include multiple ports, e.g., a first port (Port 0) 412A and a second port (Port 1) 412B. When the computing device 402 generates a memory request, the memory request is received via an input/output (IO) port provided by the host interface 408. From the perspective of the computing device, the controller 400 may only have a single port. However, the controller 400 can allocate different memory accesses to the ports 412A and 412B so that the memory accesses are performed in parallel. Each port 412 can include its own RAS timer 414 that generates clock signals for controlling the timing of operations during the RAS phase of a series of sequential memory accesses. Port 412A may include a RAS timer 414A for controlling the RAS phase of sequential accesses performed by port 412A. Likewise, port 412B may include a RAS timer 414B for controlling the RAS phase of sequential accesses performed by port 412B.

Control logic 420 may further include one or more components, such as an IO timer 422, that are shared between the ports 412. IO timer 422 is configured to generate clock signals for controlling the timing of operations during the IO phase of a series of sequential memory accesses. The clock signals generated by the RAS timer 414 and the clock signals generated by the IO timer 422 are internally processed, e.g., using combinational logic circuits, to form the output signals of the control logic 420.

Figure 5:
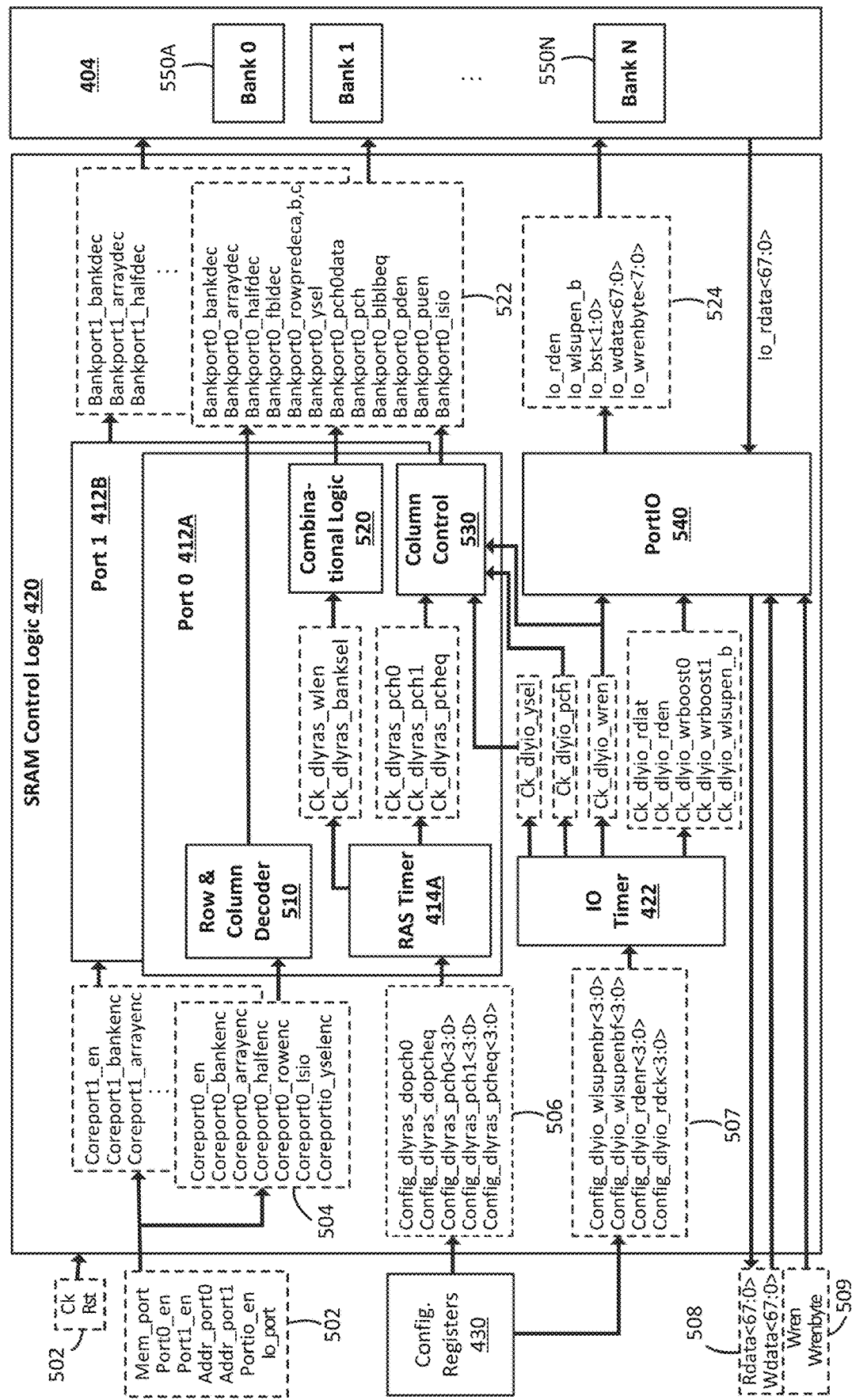
FIG. 5 is a system diagram of an example implementation of control logic for an SRAM controller, according to some embodiments.

FIG. 5 is a system diagram of an example implementation of the control logic 420, according to some embodiments. FIG. 5 illustrates the relationship between input signals of the control logic 420, output signals of the control logic, and internal signals of the control logic. The input signals to the control logic 420 may include a set of input signals 502 that are provided by the host interface 408 and input signals (506 and 507) provided by the configuration registers 430. The input signals 502 include an external clock signal (Ck), an external reset signal (Rst), signals (Port0_en and Port1_en) for enabling each of the ports, and a pair of signals (Portio_en and Io_port) indicating whether the current phase is the RAS phase or IO phase.

The input signals 502 may further include memory addresses for input to the ports 412. Each port 412 receives encoded addresses through its own address bus (e.g., Addr_port0 or Addr_port1). The control logic 420 maps the encoded addresses to a set of internal signals 504 for input to each port 412. The signals 504 to which the encoded addresses are mapped depend on the structure of the memory 404 and may include signals representing addresses at different hierarchy levels of the memory 404, for example, a bank address (Coreport*_bankenc), an array address (Coreport*_arrayenc), a half array address (Coreport*_halfenc), and/or a row address (Coreport*_rowenc). Different bit segments of Addr_port* can be assigned to these hierarchical addresses in accordance with the mapping. For instance, bits [2:0] can be mapped to columns, and bits [5:3] can be mapped to banks. As used herein, the asterisk symbol (*) represents any port number and is used to indicate that each port 412 has a corresponding signal. For example, port 0 and port 1 may receive encoded bank addresses Coreport0_bankenc and Coreport1_bankenc, respectively.

The signals 504 for any particular port 412 are input to a row and column decoder 510 within the port 412. The decoder 510 can include multiple decoder circuits, e.g., circuits corresponding to row decoder 103 and column decoders 114, 116, 118, 120, and 122 in FIG. 1. In addition to the decoder 510 and a RAS timer 414, each port 412 may include combinational logic 520 and column control logic 530 that generate the output signals of the port 412 based on the outputs of the RAS timer 414 and further based on the outputs of the IO timer 422.

Each RAS timer 414 may also receive input signals 506 corresponding to values stored in the configuration registers 430. Signals provided by the configuration registers 430 for input to the RAS timer 414 may include Config_dlyras_dopch0 for enabling a precharge operation (precharge 0) for precharging bit lines to 0, and Config_dlyras_dopcheq for enabling charge equalization. Precharge 0 can optionally be performed in addition to a precharge operation (precharge 1) for precharging bit lines to 1. The configuration registers 430 may also supply values for configuring the timing of signals generated by the RAS timer 414, e.g., using 4-bit configuration signals Config_dlyras_pch0<3:0>, Config_dlyras_pch1<3:0>, and Config_dlyras_pcheq<3:0> which control RAS timer signals relating to precharge 0, precharge 1, and bit line equalization, respectively.

Similarly, the configuration registers 430 may provide input signals 507 for configuring the timing of signals generated by the JO timer 422, including configuration signals Config_dlyio_wlsupenbr<3:0> and Config_dlyio_wlsupenbf<3:0> for configuring the rising and falling edges of a word line supply enable signal, Config_dlyio_rdenr<3:0> for configuring the timing of a read enable signal, and Config_dlyio_rdck<3:0> for configuring the timing of a read clock used to latch read data.

Control logic 420 may further include a PortIO module 540 coupled to outputs of the JO timer 422. The PortIO module 540 can include combinational logic configured to generate read and write enable signals for output to the memory 404, such as a read enable (Io_rden), a word line enable (Io_wlsupen_b), a write-assist enable (Io_bst) for boosting word line voltage during writes (e.g., to form the boosted voltage VBST in FIG. 3), and a byte enable (Io_wrenbyte<7:0>). The PortIO module 540 is controlled by a subset of outputs from the IO timer 422, including the following signals: Ck_dlyio_rdlat, Ck_dlyio_wren, Ck_dlyio_rden, Ck_dlyio_wrboost0, Ck_dlyio_wrboost1, and Ck_dlyio_wlsupen_b.

The PortIO module 540 is configured to receive data from a read data bus (Io_rdata<67:0>) and to drive a write data bus (Io_wdata<67:0>). Both of these buses couple the PortIO module 540 to the memory 404. Since the host interface 408 may only expose a single port to a requestor device (e.g., computing device 402), a single set of corresponding data buses 508 (Rdata<67:0> and Wdata<67:0>) on the host-facing side of the PortIO module is sufficient. PortIO module 540 drives the write data bus Io_wdata based on write signals 509 from the host interface, including a write enable signal (Wren) and a byte enable signal (Wrenbyte, corresponding to Io_wrenbyte). Further, as described below, ports 412 can operate in parallel, with overlap of multiple bursts and so that latency associated with the RAS phase of one or more ports is hidden from the host/requestor device. The parallel operation of ports 412 allows for high throughput without implementing a wider data bus for communicating data to and from the requestor device. Further, since the ports 412 share a single set of data buses 508, implementation of multiple external (host-facing) ports can be avoided together with the duplication of components that is typically required for multiple external ports (e.g., two word line drivers, two sets of bit lines, two sense amplifiers, etc.).

In some embodiments, less than the physical bit width of the read and write buses is available during memory accesses because one or more local columns in each row of the memory 404 are reserved for use as repair/redundant columns. When a defective column is identified during manufacturing of the memory, the defective column can be mapped onto one of the redundant columns. Accordingly, the effective width of the read and write buses could be 64-bit in the case of four repair columns.

Row and column decoder 510 is configured to generate decoded addresses during the RAS phase through decoding the encoded addresses to which Addr_port0 or Addr_port1 are mapped (the addresses that form part of the signals 504). The decoded addresses may correspond to Bankport*_bankdec, Bankport*_arraydec, Bankport*_halfdec, Bankport*_fbldec, Bankport*_rowpredeca, Bankport*_rowpredecb, Bankport*_rowpredecc and/or other signals indicating which portions of the memory 404 (e.g., individual row segments) are being accessed. Decoder 510 also generates decoded column addresses. Columns can be addressed individually through a column select signal (Bankport*ysel) generated by the decoder 510 based on Coreportio_yselenc (another signal among the signals 504). In addition to the decoded addresses, the decoder 510 may also generate a signal (Bankport*_isio) to indicate to the memory 404 whether the current phase is the IO phase or the RAS phase. The controller 400 and/or the memory 404 can include logic that takes the current phase into consideration in order to ensure operational correctness and/or to save power. For example, the memory 404 can include gate circuitry configured to save power by disabling read and write driver related signals during the RAS phase. As another example, Bankport*_ysel can be driven to VDD during the RAS phase.

The decoded addresses, which include port-specific row and column addresses, are input to the memory 404 to drive accesses according to timing control signals generated by the combinational logic 520 and the column control logic 530. Timing control signals are generated for both the RAS phase and the IO phase and include control signals that determine the timing of various operations. For example, the timing control signals can control the timing of precharge 0 and precharge 1 (Bankport*_pch0data and Bankport*_pch, respectively), bit line equalization (Bankport*_blblbeq), driving bit lines to 1 (e.g., to VDD or a boosted voltage) via write-driver pull up (Bankport*_puen), and driving bit lines to 0 via write-driver pull down (Bankport*_pden).

Combinational logic 520 is controlled by Ck_dlyras_wlen and Ck_dlyras_banksel from the RAS timer 414. Column control logic 530 is controlled by Ck_dlyras_pch0, Ck_dlyras_pch1, and Ck_dlyras_pcheq from the RAS timer 414. Column control logic 530 is further controlled by Ck_dlyio_ysel, Ck_dlyio_wren, and Clk_dlyio_pch, from the IO timer 422. These three inputs from the IO timer 422 are used by the column control logic 530 to generate Bankport*_ysel, Bankport*_pden, Bankport*_puen as column-specific control signals.

As shown in FIG. 5, the memory 404 may be divided into multiple SRAM banks 550 (e.g., banks 550A to 550N). Each bank 550 may include a bit cell array organized in a similar fashion to the bit cell array in FIG. 2. The bit cell array within each bank 550 can include multiple global columns, with the number of global columns typically being equal to the bit width of the read and write data buses (Rdata and Wdata). For example, if Rdata and Wdata are 68-bit as discussed above, each bank can include 68 global columns. The global columns in a bank are usually accessed concurrently, with some exceptions such as when a byte enable signal is used to mask certain bits so that those bits are not read/written. Accordingly, although FIG. 2 shows an example with a single global column 209, multiple global columns would typically be used in practice. The outputs of each port 412 (the signals collectively labeled 522) and the outputs of the PortIO module 540 (the signals collectively labeled 524) may be coupled to each bank 550 of the memory 404 for read and write timing control in every memory clock cycle, e.g., each cycle of the Ck signal.

The following is a summary of the signals shown in FIG. 5 and in subsequent drawings:

External Input Signals
  Ck—Input clock signal that is passed into the RAS timer and the IO timer as gated clock signals Clk and Ckio, respectively. Clk is disabled during IO timer operation, and Ckio is disabled during RAS timer operation to reduce power consumption.
  Rst—External reset signal.
  Mem_port—Indicates which of port 0 and port 1 is selected for the current access.
  Port0_en—Enables operation of port 0, indicates whether port 0 is in use.
  Port1_en—Enables operation of port 1, indicates whether port 1 is in use.
  Addr_port0—Input memory address to port 0. Is mapped to the following internal address signals for input to the row and column decoder 510 of port 0:
    Coreport0_bankenc—Encoded bank address
    Coreport0_arrayenc—Encoded array address
    Coreport0_halfenc—Encoded half-array address
    Coreport0_rowenc—Encoded row address.
  Addr_port1—Input memory address to port 1. Analogous to Addr_port0 and similarly mapped to corresponding internal address signals.
  Portio_en—Set to 0 or 1 to indicate that the current clock cycle is RAS or IO, respectively.
  Io_port—Set to 0 when Bankport0_isio=1. Set to 1 when Bankport1_isio=1.
  Rdata<67:0> Read data bus, carries data read from memory.
  Wdata<67:0> Write data bus, carries data to be stored into memory.
  Wren—Write enable signal.

Wrenbyte—Enables writing to individual bytes of memory.

Configuration Register Signals for RAS Timer:

Config_dlyras_dopch0—Indicates whether precharging of bit lines to 0 (precharge 0) will be performed. Precharge 0 can be performed on all local bit lines associated with the same global column or global column range.

Config_dlyras_dopch1—Indicates whether precharging of bit lines to 1 (precharge 1) will be performed. Precharge 1 can be performed on all local bit lines associated with the same global column or global column range.

Config_dlyras_dopcheq—Indicates whether equalization of the voltages on BL and BLB in a bit line pair will be performed. Equalization can be performed on all local bit lines associated with the same global column or global column range.

Config_dlyras_pch0<3:0> Sets the configurable delay value for dlyras_pch0f.

Config_dlyras_pch1<3:0> Sets the configurable delay value for dlyras_pch1f.

Config_dlyras_pcheq<3:0> Sets the configurable delay value for dlyras_pcheqf.

RAS Timer Internal Signals

Dlyras_bankselr—Input for generating rising edges of Ck_dlyras_banksel. This is a delayed version of Port0_en or Port1_en. The falling edges of Ck_dlyras_banksel are controlled by the falling edges of Port0_en or Port1_en.

Dlyras_pch0f—Input for generating falling edges of Ck_dlyras_pch0.

Dlyras_pch0r—Input for generating rising edges of Ck_dlyras_pch0.

Dlyras_pch1f—Input for generating falling edges of Ck_dlyras_pch1.

Dlyras_pch1r—Input for generating rising edges of Ck_dlyras_pch1.

Dlyras_pcheqf—Input for generating falling edges of Ck_dlyras_pcheq.

Dlyras_pcheqr—Input for generating rising edges of Ck_dlyras_pcheq.

Dlyras_wlenr—Input for generating rising edges of Ck_dlyras_wlen. Falling edges of Ck_dlyras_wlen are controlled by the falling edges of Port0_en or Port1_en.

RAS Timer Output Signals

Ck_dlyras_banksel—Clock for timing control of bank selection.

Ck_dlyras_pch0—Clock for timing control of precharge 0.

Ck_dlyras_pch1—Clock for timing control of precharge 1.

Ck_dlyras_pcheq—Clock for timing control of equalization.

Ck_dlyras_wlen—Clock for timing control of word line enable.

Configuration Register Signals for IO Timer

Config_dlyio_wlsupenbr<3:0> Sets the configurable delay value for Dlyio_wlsupenbr.

Config_dlyio_wlsupenbf<3:0> Sets the configurable delay value for Dlyio_wlsupenbf.

Config_dlyio_rdenr<3:0> Sets the configurable delay value for Dlyio_rdenr.

Config_dlyio_rdck<3:0> Sets the configurable delay value for Dlyio_rdckr.

IO Timer Internal Signals

Dlyio_rdenr—Input for generating rising edges of Ck_dlyio_rden.

Dlyio_rdenf—Input for generating falling edges of Ck_dlyio_rden.

Dlyio_wrenr—Input for generating rising edges of Ck_dlyio_wren.

Dlyio_wrenf—Input for generating falling edges of Ck_dlyio_wren.

Dlyio_yselr—Input for generating rising edges of Ck_dlyio_ysel.

Dlyio_yself—Input for generating falling edges of Ck_dlyio_ysel.

Dlyio_pchr—Input for generating rising edges of Ck_dlyio_pch.

Dlyio_pchf—Input for generating falling edges of Ck_dlyio_pch.

Dlyio_wrboost0r—Input for generating rising edges of Ck_dlyio_wrboost0.

Dlyio_wrboost0f—Input for generating falling edges of Ck_dlyio_wrboost0.

Dlyio_wrboost1r—Input for generating rising edges of Ck_dlyio_wrboost1.

Dlyio_wrboost1f—Input for generating falling edges of Ck_dlyio_wrboost1.

Dlyio_wlsupenbr—Input for generating rising edges of Ck_dlyio_wlsupen_b.

Dlyio_wlsupenbf—Input for generating falling edges of Ck_dlyio_wlsupen_b.

Dlyio_rdckr—Corresponds to rising edges of Ck_dlyio_rdlat.

IO Timer Output Signals

Ck_dlyio_rden—Clock for timing control of read enable.

Ck_dlyio_wren—Clock for timing control of write enable.

Ck_dlyio_ysel—Clock for timing control of column select.

Ck_dlyio_pch—Clock for timing control of precharge operations for both precharge 0 and precharge 1.

Ck_dlyio_wrboost0—Clock for timing control of word line boost.

Ck_dlyio_wrboost1—Clock for timing control of word line boost. Forms a 2-bit signal together with Ck_dlyio_wrboost0 to set the magnitude of the word line boost voltage. Possible value combinations for Ck_dlyio_wrboost0 and Ck_dlyio_wrboost1, respectively:

00—No boost.

10—Lowest boost voltage.

01—Mid-level boost voltage.

11—Highest boost voltage.

Ck_dlyio_wlsupen_b—Clock for timing control of word line supply enable (bar).

Ck_dlyio_rdlat—Delayed version of Ckio for driving the clock port of memory interface read latches to store read data.

SRAM Controller Output Signals for Port 0 (Similar set of signals for port 1)

Bankport0_bankdec—Decoded bank address for port 0.

Bankport0_arraydec—Decoded array address for port 0.

Bankport0_halfdec—Decoded half array address for port 0.

Bankport0_fbldec—Decoded row address portion for port0. Indicates the row segments of the memory macro.

Bankport0_rowpredeca,b,c—Three signals, each forming a decoded row address portion for port 0; a, b, and c are associated with different address fields corresponding to different row segments of the memory macro.

Bankport0_ysel—Column select for port 0.

Bankport0_pch0data—Precharge control for port 0 to discharge bit lines to logic 0.

Bankport0_pch—Precharge control for port 0 to precharge bit lines to logic 1.

Bankport0_blblbeq—Equalization control for port 0.

Bankport0_pden—Write driver pull-down enable.

Bankport0_puen—Write driver pull-up enable.

Bankport0_isio—Indicates whether currently in IO phase or RAS phase.

SRAM Controller IO Data and IO Control Signals (for both port 0 and port 1)

Io_rden—Read enable for IO phase, generated based on Ck_dlyio_rden.

Io_wlsupen_b—Word line supply enable (bar) for IO phase, generated based on Ck_dlyio_wlsupen_b and Ck_dlyio_wren.

Io_bst<1:0>—Write-assist enable, generated based on Ck_dlyio_wrboost0 and Ck_dlyio_wrboost1.

Io_wdata<67:0>—Bus that carries the write data during the IO phase. The write data is supplied from Wdata<67:0>.

Io_rdata<67:0>—Bus that carries the read data during the IO phase. The read data is sent to Rdata<67:0>.

Io_wrenbyte<7:0>—Connected to Wrenbyte from the host interface (1:1 mapping) and is active during the IO phase. An 8-bit signal to control 64 bits of read or write data (e.g., 1 bit of this signal controls 8 bits of read or write data). In the example of FIG. 5, Wdata and Rdata can be 68-bit buses with 64 local columns being used during normal operation, and with 4 redundant columns that can be reserved for use as repair bits.

Figure 6:
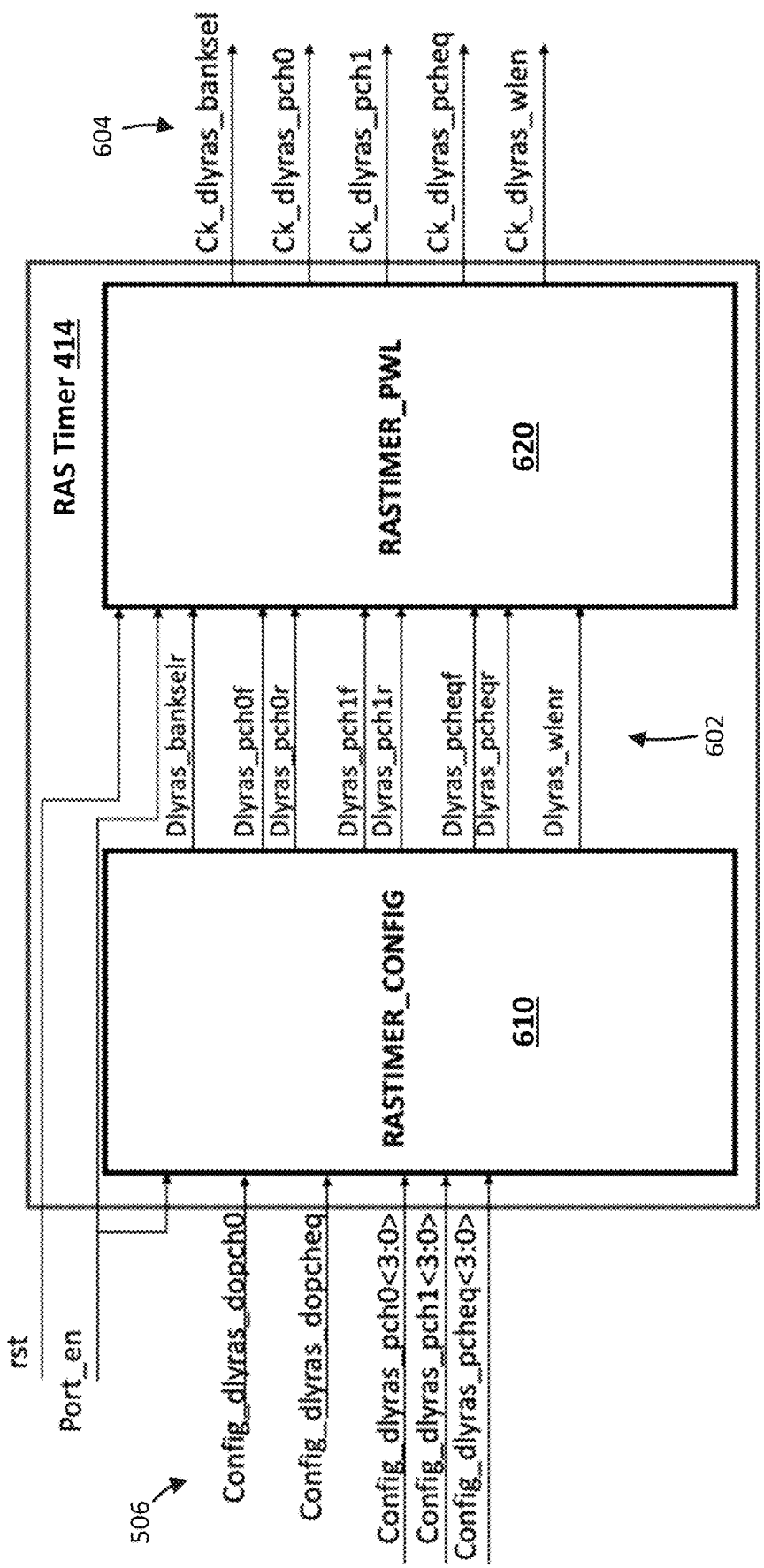
FIG. 6 is a block diagram of an example implementation of a RAS timer in an SRAM controller, according to some embodiments.

FIG. 6 is a block diagram of an example implementation of the RAS timer 414, according to some embodiments. RAS timer 414 may include a configuration unit 610 (RAS-TIMER_CONFIG) and a pulse generation unit 620 (RAS-TIMER_PWL). Both the configuration unit 610 and the pulse generation unit 620 receive a reset signal (rst) and a port enable signal (Port_en) as inputs. Rst and Port_en correspond to the external reset signal Rst and Coreport*_en in FIG. 5, respectively.

Configuration unit 610 also receives the signals 506 from the configuration registers 430. The configuration unit 610 processes the signals 506 to form a set of signals 602 for input to the pulse generation unit 620. In turn, the pulse generation unit 620 produces a set of clock signals 604. As shown in FIG. 5, a first subset of the clock signals 604 relating to word line enable and bank selection are input to the combinational logic 520, while a second subset of the clock signals 604 relating to precharge and equalization are input to the column control logic 530.

Figure 7:
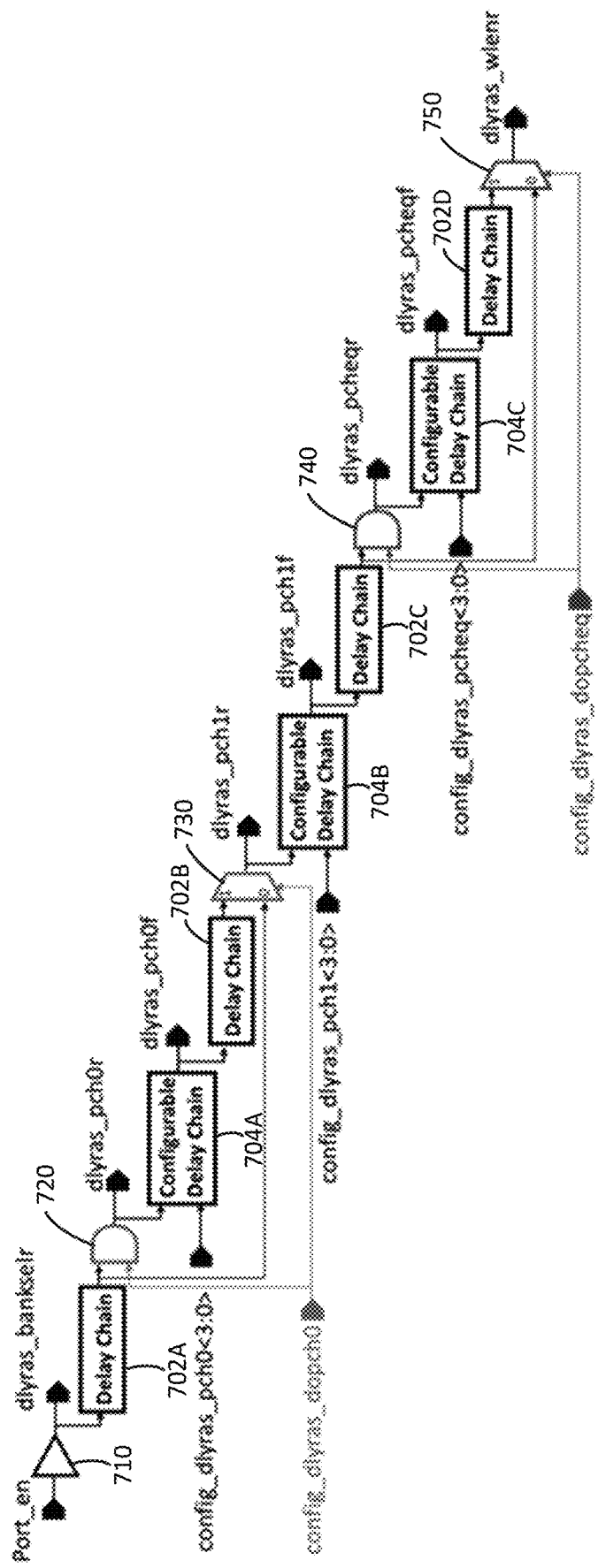
FIG. 7 shows a schematic of a configuration unit in a RAS timer, according to some embodiments.

FIG. 7 shows a schematic of the configuration unit 610, according to some embodiments. As shown in FIG. 7, the configuration unit 610 can be formed using a series of delay chains. The delays chains may include fixed delay chains 702A to 702D and configurable delay chains 704A to 704C. The delay chains 702 and 704 are connected via logic gates and multiplexers to sequentially form, in response to the Port_en signal, the signals 602 in FIG. 6. Port_en is input to a buffer 710 to form Dlyras_bankselr, which controls the rising edges of Ck_dlyras_banksel.

Dlyras_bankselr is input to fixed delay chain 702A so that a delayed version of Dlyras_bankselr is generated for input to an AND gate 720. The AND gate 720 also receives Config_dlyras_dopch0 as an input. Based on these two inputs, the AND gate 720 generates Dlyras_pch0r, which controls the rising edges of Ck_dlyras_pch0.

Dlyras_pch0r is input to configurable delay chain 704A to form Dlyras_pch0f for input to fixed delay chain 702B. Dlyras_pch0f controls the falling edges of Ck_dlyras_pch0. The amount of delay through the configurable delay chain 704A is determined by the value of Config_dlyras_pch0<3:0>.

Dlyras_pch0f is input to fixed delay chain 702B to form a delayed version of Dlyras_pch0f for input to a multiplexer (MUX) 730. The MUX 730 selects between the delayed version of Dlyras_pch0f and the delayed version of Dlyras_bankselr (from the fixed delay chain 702A) based on the value of Config_dlyras_dopch0. The MUX 730 outputs Dlyras_pch1r, which controls the rising edges of Ck_dlyras_pch1. Together with the AND gate 720, the MUX 730 allows the precharging of bit lines to 0 (precharge 0) to be bypassed depending on Config_dlyras_dopch0.

Dlyras_pch1r is input to configurable delay chain 704B to form Dlyras_pch1f for input to fixed delay chain 702C. The amount of delay through the configurable delay chain 704B is determined by the value of Config_dlyras_pch1<3:0>.

Dlyras_pch1f is input to fixed delay chain 702C to form a delayed version of Dlyras_pch1f for input to an AND gate 740. The AND gate 740 also receives Config_dlyras_dopcheq as an input. Based on these two inputs, the AND gate 740 generates Dlyras_pcheqr, which controls the rising edges of Ck_dlyras_pcheq.

Dlyras_pcheqr is input to configurable delay chain 704C to form Dlyras_pcheqf, which controls the falling edges of Ck_dlyras_pcheq. The amount of delay through the configurable delay chain 704C is determined by the value of Config_dlyras_pcheq<3:0>.

Dlyras_pcheqf is input to fixed delay chain 702D to form a delayed version of Dlyras_pcheqf for input to a MUX 750. The MUX 750 selects between the delayed version of Dlyras_pcheqf and the delayed version of Dlyras_pch1f (from the fixed delay chain 702C) based on the value of Config_dlyras_dopcheq. The MUX 750 outputs Dlyras_wlenr, which controls the rising edges of Ck_dlyras_wlen. Together with the AND gate 740, the MUX 750 allows bit line equalization to be bypassed depending on Config_dlyras_dopcheq.

Figure 8:
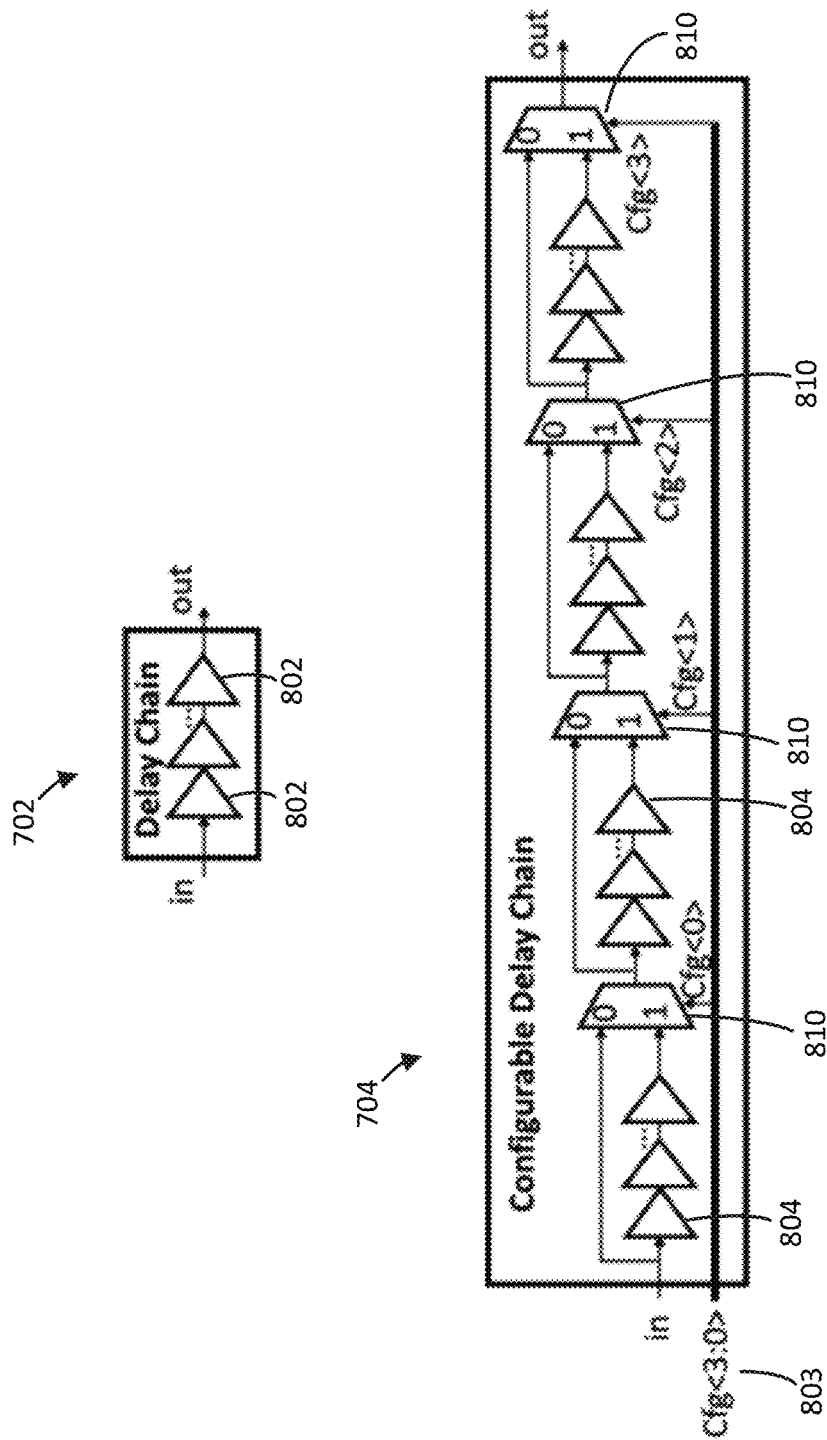
FIG. 8 shows example implementations of a fixed delay chain and a configurable delay chain, according to some embodiments.

FIG. 8 shows example implementations of the fixed delay chain 702 and the configurable delay chain 704 in FIG. 7, according to some embodiments. Fixed delay chain 702 includes one or more buffers 802. For instance, a fixed delay chain can be formed by connecting three or more buffers 802 in series, as shown. Configurable delay chain 704 includes multiple delay stages. Like the fixed delay chain 702, each delay stage within the configurable delay chain 704 includes one or more buffers 804. Each buffer 802 and each buffer 804 delays its input by a fixed amount. In some implementations, buffers 802 and buffers 804 are identical. Alternatively, buffers 802 can provide a different delay than buffers 804. In addition to one or more buffers 804, each delay stage includes a MUX 810. In the example shown, there are four MUXs 810, each MUX controlled by a corresponding bit of a configuration signal (Cfg) 803. The configuration signal 803 can be Config_dlyras_pch0<3:0>, Config_dlyras_pch1<3:0>, or Config_dlyras_pcheq<3:0>. Each MUX 810 selects between a delayed input and non-delayed input, with the delayed input being formed at the output of the one or more buffers 804. For example, when the input to the MUX 810 is 1 the MUX may select the delayed input, and when the input to the MUX 810 is 0 the MUX may select the non-delayed input. When implemented in this manner, the shortest delay through the configurable delay chain 704 would correspond to a configuration value of "0000" and the largest delay would correspond to a configuration value of "1111." Accordingly, the one or more buffers 804 in any particular delay stage can be bypassed depending on the value of the configuration bit that is provided to the MUX 810.

Figure 9A:
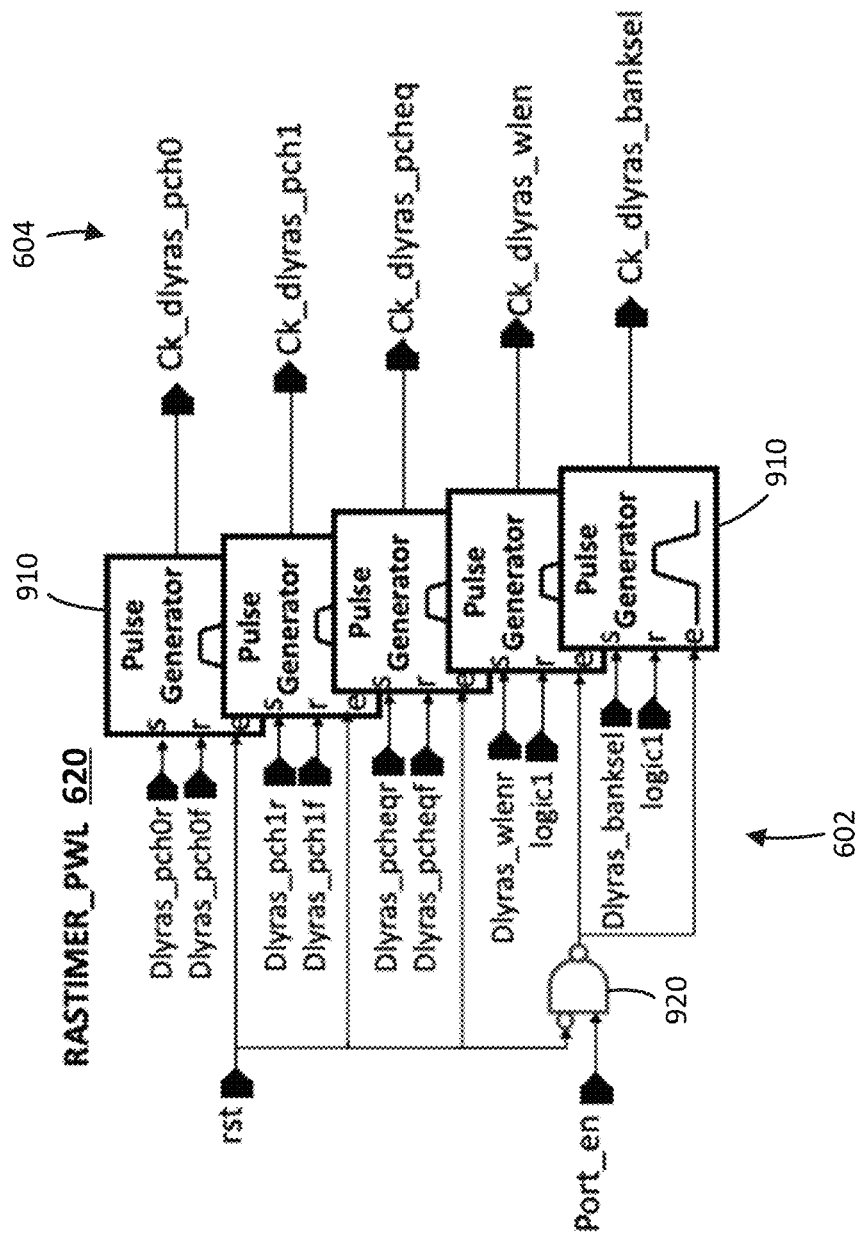
FIG. 9A shows an example implementation of a pulse generation unit in a RAS timer, according to some embodiments.

FIG. 9A shows an example implementation of the pulse generation unit 620, according to some embodiments. The pulse generation unit 620 includes a set of pulse generators 910. Each pulse generator 910 produces a corresponding one of the clock signals 604 at its output port based on signals received at three input ports: set (s), reset (r), and enable/external reset (e). The enable port e can be an active-low port. Each set port s is connected to a corresponding one of the signals 602 that controls the rising edge of the output of the pulse generator 910. For example, when Dlyras_pch0r transitions from 0 to 1, Ck_dlyras_pch0 changes from 0 to 1. Similarly, and with the exception of the pulse generators that form Ck_dlyras_wlen and Ck_dlyras_banksel, each reset port r is connected to a corresponding one of the signals 602 that controls the falling edge of the output of the pulse generator 910. For example, when Dlyras_pch0f transitions from 0 to 1, Ck_dlyras_pch0 changes from 1 to 0.

Each enable port e is connected to the same external reset signal (e.g., Rst in FIG. 5). The external reset signal functions as a global reset to clear the outputs of all pulse generators 910. In the case of the pulse generators that form Ck_dlyras_wlen and Ck_dlyras_banksel, the reset port r is tied to logic 1 (e.g., VDD), and the external reset signal is provided as an inverted input to a NAND gate 920 rather than being directly connected to the enable port e. The NAND gate 920 also receives Port_en (either Port0_en or Port1_en) as an input so that the falling edges of Ck_dlyras_wlen and Ck_dlyras_banksel are set by the inverse of Port_en. When the reset port r is tied to logic 1, the falling edge of the generated clock signal follows the falling edge of Port_en or Rst. For example, when Port_en is de-asserted, Ck_dlyras_banksel is reset to logic 0.

Figure 9B:
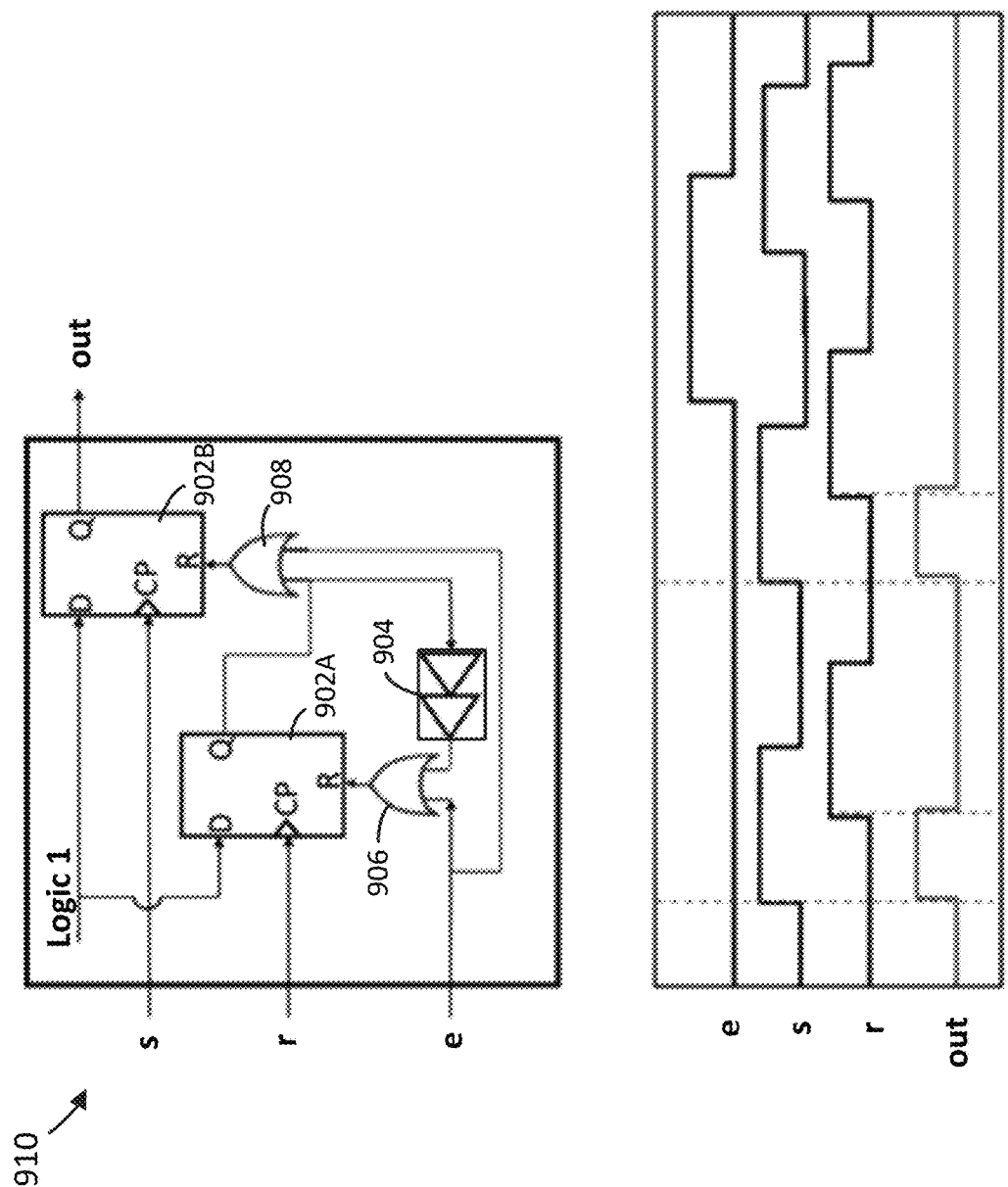
FIG. 9B shows a schematic of a pulse generator in a pulse generation unit along with a corresponding timing diagram, according to some embodiments.

FIG. 9B shows a schematic of the pulse generator 910 in FIG. 9A along with a corresponding timing diagram. As shown in FIG. 9B, each pulse generator 910 can be implemented using a pair of D-flip-flops (DFFs) 902A and 902B, each DFF having its own input (D), output (Q), clock (CP), and asynchronous reset (R). The set port s of the pulse generator 910 connects to the clock CP of the second DFF 902B, and the reset port r of the pulse generator 910 connects to the clock CP of the first DFF 902A. The inputs D of both DFFs are tied to logic 1. The output Q of the first DFF 902A is connected via a feedback loop to the reset R of the first DFF 902A through a delay cell 904 that generates a delayed version of Q (delayed_Q). The delay cell 904 can be implemented in a similar manner to the fixed delay chain 702 in FIG. 8.

Delayed_Q is input to a first OR gate 906 together with the external reset signal received at the enable port e to form the input to the reset R of the first DFF 902A. Similarly, the output Q of the first DFF 902A is input to a second OR gate 908 together with the external reset signal to form the input to the reset R of the second DFF 902B. The output (out) of the pulse generator 910 corresponds to the output Q of the second DFF 902B. The timing diagram in FIG. 9B shows that when the external reset signal at the enable port (e) is 0, 0 to 1 transitions of set (s) and reset (r) trigger the rising edge and falling edge, respectively, of the signal formed at the output of the pulse generator 910. When the external reset signal is 1, the output of the pulse generator 910 is reset to 0.

FIGS. 10A to 10D show example timing diagrams for different configurations of the RAS timer 414, according to some embodiments. The timing diagrams in FIGS. 10A and 10B were produced by driving Config_dlyras_pch0<3:0>, Config_dlyras_pch1<3:0>, and Config_dlyras_pcheq<3:0> using the same configuration signal (Config_dlyras_pch<3:0>), which can be provided by a single configuration register 430. Thus, the pulse widths of these three RAS timer outputs are identical, with the pulse width being shorter in FIG. 10A as a result of using a configuration value of 3 instead of 6 as in FIG. 10B. However, as discussed above in connection with FIG. 4, multiple configuration registers can be used so that the clock signals produced by the RAS timer differ in duration.

Figures 10A, 10B:
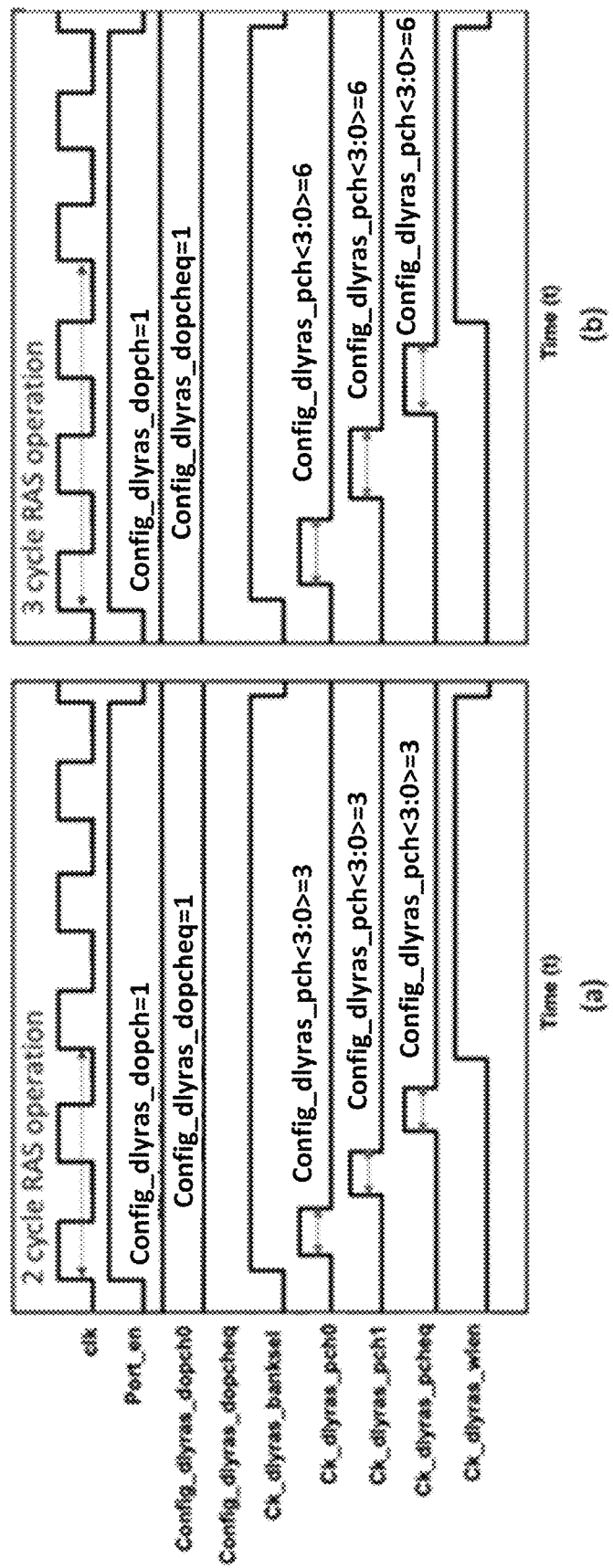
FIGS. 10A to 10D show example timing diagrams for different configurations of a RAS timer, according to some embodiments.

In FIGS. 10A and 10B, Config_dlyras_dopch0 and Config_dlyras_dopcheq are set to 1 so that a clock pulse is formed for each of Ck_dlyras_pch0, Ck_dlyras_pch1 and Ck_dlyras_pcheq to perform precharging of bit lines to 0 (precharge 0), precharging of bit lines to 1 (precharge 1), and equalization of bit line voltages, respectively. In some embodiments, precharging and equalization are performed for all local bit lines connected to the same global bit line. For example, referring back to FIG. 2, Config_dlyras_dopch0 can be used to trigger precharging to 0 of all local columns 205 within the global column 209. Similarly, Ck_dlyras_pcheq can be used to trigger equalization of all local columns 205 within the global column 209. Accordingly, in both FIG. 10A and FIG. 10B, every local bit line that is connected to the same global bit line may first be discharged to 0, then charged to VDD before equalization of the voltages on BL and BLB. Although performing precharging and equalization of multiple local bits lines in the same RAS phase incurs added latency, this may result in a reduction of precharge energy during the IO phase.

Figures 10C, 10D:
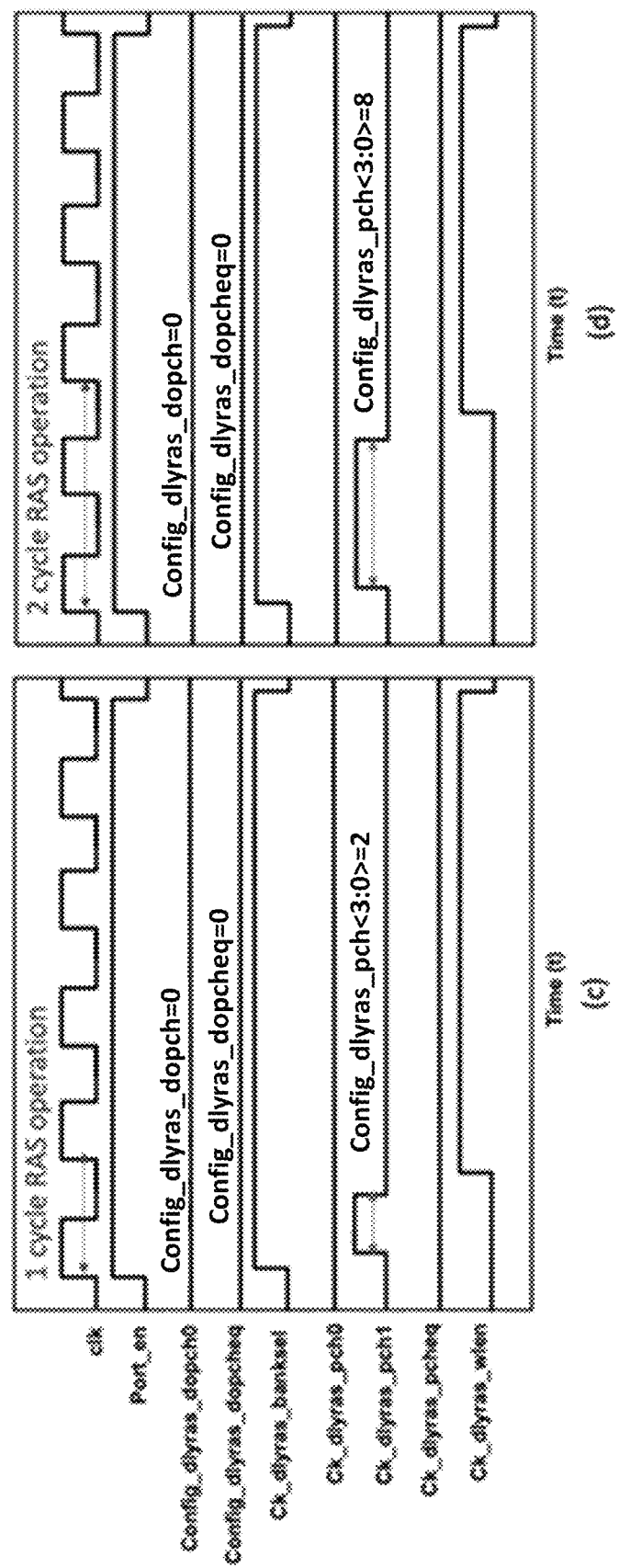

In FIGS. 10C and 10D, Config_dlyras_dopch0 and Config_dlyras_dopcheq are set to 0 so that a clock pulse is generated for Ck_dlyras_pch1, while Ck_dlyras_pch0 and Ck_dlyras_pcheq are bypassed. Accordingly, every local bit line that is connected to the same global bit line may be charged to VDD without precharging to 0 beforehand and without performing equalization afterwards. Precharging to 0 and/or equalization can be omitted, for example, when the memory performance requirements are less stringent (e.g., a greater number of read or write errors is acceptable), when less power consumption is desired, when the operating voltage of the memory is higher (e.g., so that precharging to 1 takes less time), or when the operating frequency of the memory is higher (since there is less time available to perform row conditioning). Thus, RAS timer 414 can be configured to optimize the tradeoff between power and performance for different operating environments while maintaining an appropriate relative timing between the clock signals generated by the RAS timer to ensure correct memory operation.

FIGS. 10A to 10D differ in regard to the number of clock cycles (e.g., cycles of the Ck signal in FIG. 5) taken in completing the operations associated with the RAS phase. The number of clock cycles is set according to the value of Config_dlyras_pch<3:0>, which controls the pulse widths of the clock signals Ck_dlyras_pch0, Ck_dlyras_pch1 and Ck_dlyras_pcheq.

In FIG. 10A, Config_dlyras_pch<3:0> has a value of 3 (i.e., 0011) to set a two cycle RAS phase. In FIG. 10B, Config_dlyras_pch<3:0> has a value of 6 (i.e., 0110) to set a three cycle RAS phase. In FIG. 10C, Config_dlyras_pch<3:0> has a value of 2 (i.e., 0010) to set a one cycle RAS phase. In FIG. 10D, Config_dlyras_pch<3:0> has a value of 8 (i.e., 1000) to set a two cycle RAS phase. A larger configuration value is used to achieve two cycle RAS in FIG. 10D compared to FIG. 10A because the duration of the two clock cycles is taken up by a single operation (precharge 1) as opposed to being divided (e.g., evenly) among precharge 0, precharge 1, and equalization.

Figure 11:
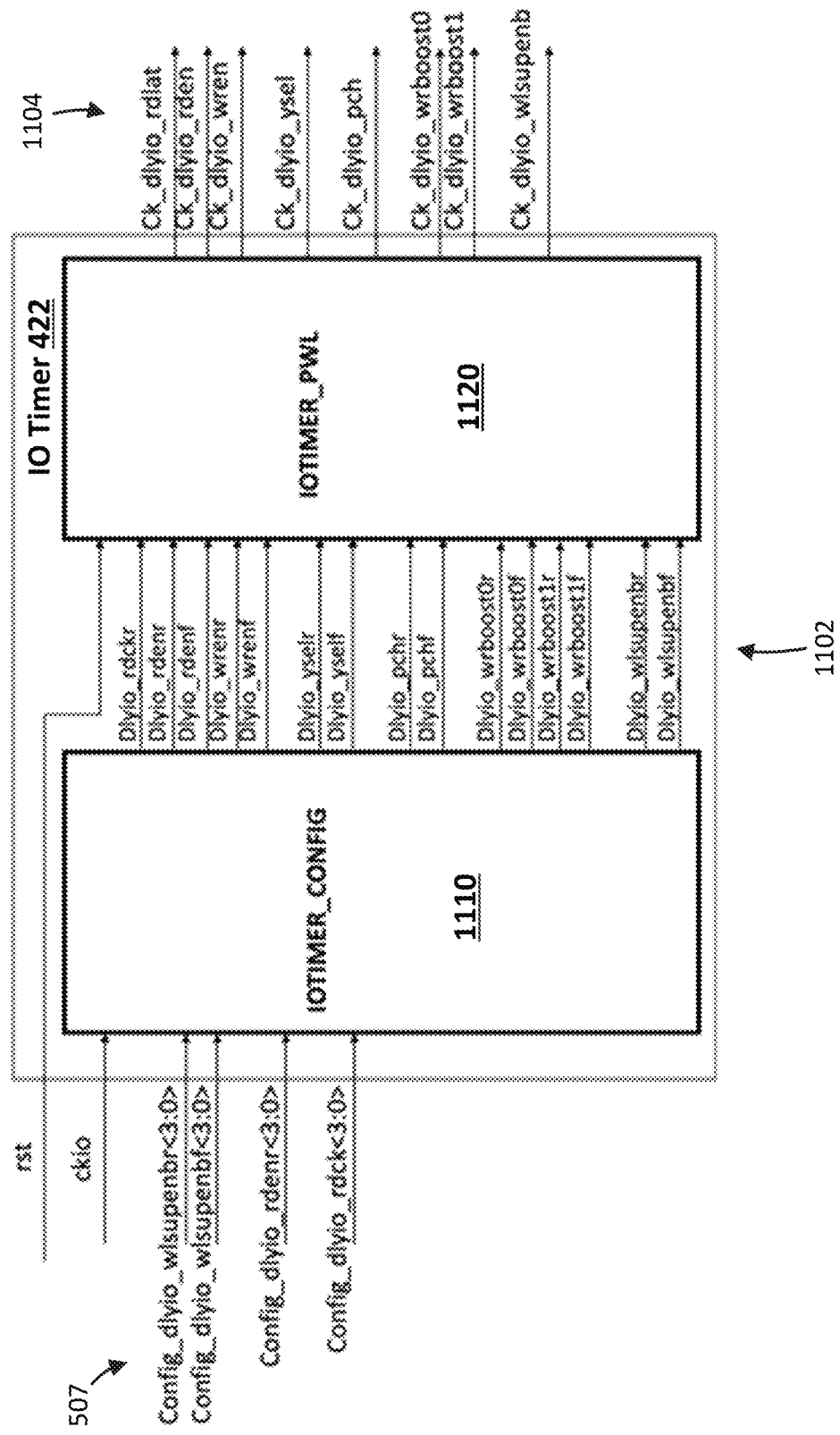
FIG. 11 is a block diagram of an example implementation of an IO timer in an SRAM controller, according to some embodiments.

FIG. 11 is a block diagram of an example implementation of the IO timer 422, according to some embodiments. IO timer 422 may include a configuration unit 1110 (IOTIMER_CONFIG) and a pulse generation unit 1120 (IOTIMER_PWL). Configuration unit 1110 and pulse generation unit 1120 can be configured in a similar manner to the configuration unit 610 and pulse generation unit 620, respectively, of the RAS timer in FIG. 6. Both the configuration unit 1110 and the pulse generation unit 1120 receive the reset signal (rst) and a clock signal (Ckio) as inputs. Ckio is a gated version of Ck in FIG. 5 and is disabled during the RAS phase.

Configuration unit 1110 also receives the signals 507 from the configuration register(s) 430. The configuration unit 1110 processes the signals 507 to form a set of signals 1102 for input to the pulse generation unit 1120. In turn, the pulse generation unit 1120 produces a set of clock signals 1104. As shown in FIG. 5, a first subset of the clock signals 1104 relating to column selection, precharging during the IO phase, and write enable are input to the column control logic 530, while a second subset of the clock signals 1104 relating to write enable, read latching, read enable, word line boosting, and word line supply enable are input to the PortIO module 540. As with the configuration signals input to the configuration unit 610 of the RAS timer, the configuration signals input to the configuration unit 1110 of the IO timer can be driven using a single configuration register or multiple configuration registers depending on desired clock duration.

Figure 12:
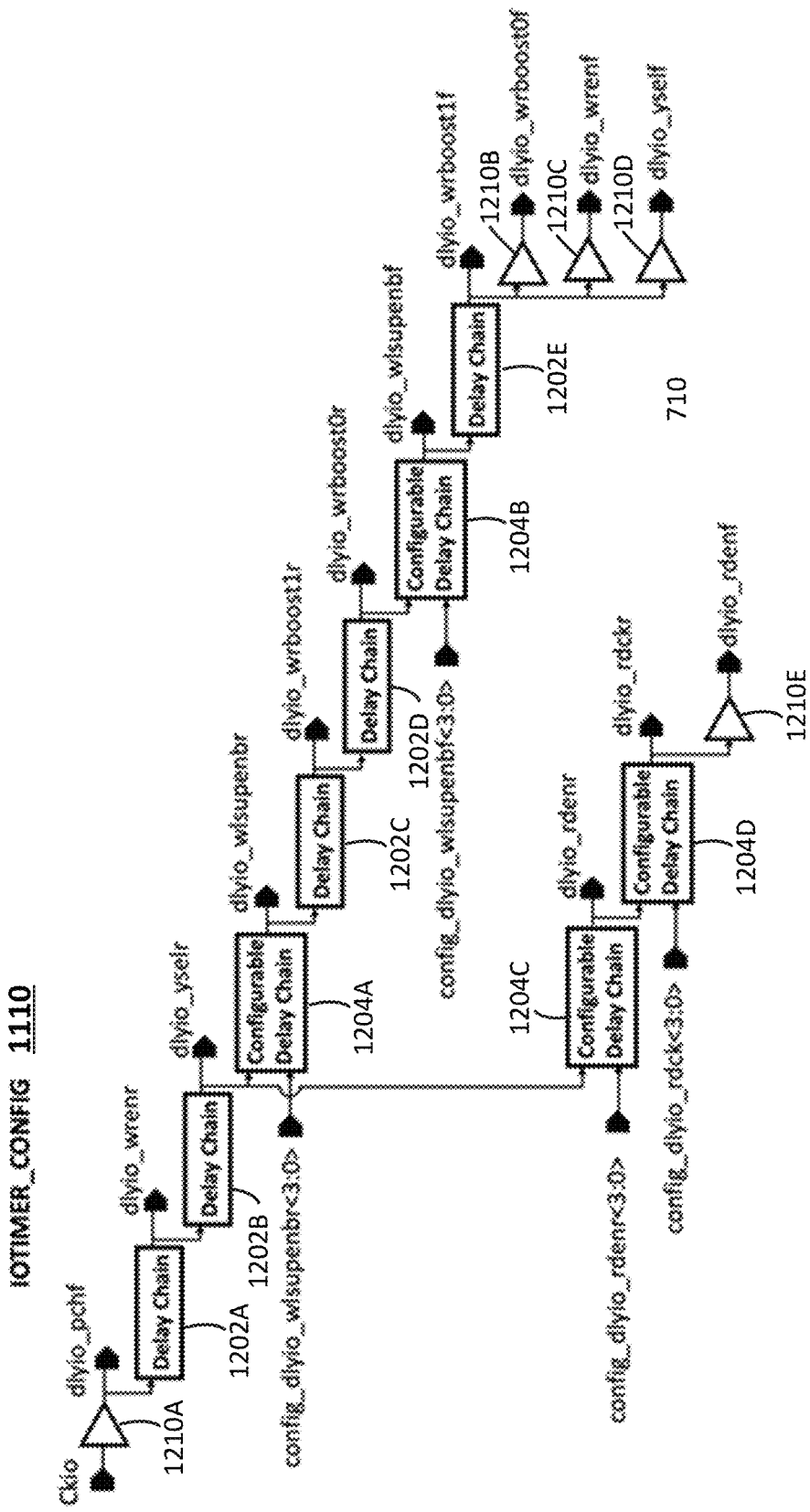
FIG. 12 shows a schematic of a configuration unit in an IO timer, according to some embodiments.

FIG. 12 shows a schematic of the configuration unit 1110, according to some embodiments. As shown in FIG. 12, the configuration unit 1110 can be formed using a series of delay chains. The delays chains may include fixed delay chains 1202A to 1202E and configurable delay chains 1204A to 1204D. The delay chains 1202 and 1204 are connected to sequentially form, in response to the Ckio signal, the signals 1102 in FIG. 11. Ckio is input to a buffer 1210A to form Dlyio_pchf, which controls the falling edges of Ck_dlyio_pch. The components of the configuration unit 1110 can be implemented in the same manner as their counterparts in the RAS timer. For example, buffers 710 and buffers 1210 may be identical. Similarly, fixed delay chains 1202 and configurable delay chains 1204 may be identical to fixed delay chains 702 and configurable delay chains 704, respectively (e.g., implemented in accordance with FIG. 8).

Dlyio_pchf is input to fixed delay chain 1202A to generate Dlyio_wrenr as a delayed version of Dlyio_pchf. In turn, Dlyio_wrenr is input to fixed delay chain 1202B to generate Dlyio_yselr for input to configurable delay chain 1204A. The amount of delay through the configurable delay chain 1204A is determined by the value of Config_dlyio_wlsupenbr<3:0>.

The output of configurable delay chain 1204A (Dlyio_wlsupenbr) is input to fixed delay chain 1202C to generate Dlyio_wrboost1r for input to fixed delay chain 1202D. The output of fixed delay chain 1202D (Dlyio_wrboost0r) is input to configurable delay chain 1204B to generate Dlyio_wlsupenbf for input to fixed delay chain 1202E. The amount of delay through the configurable delay chain 1204B is determined by the value of Config_dlyio_wlsupenbf<3:0>. The output of fixed delay chain 1202E (Dlyio_wrboost1f) is buffered in parallel through buffers 1210B, 1210C, and 1210D to form Dlyio_wrboost0f, Dlyio_wrenf, and Dlyio_ysef, respectively.

Dlyio_yselr is also input to configurable delay chain 1204C to form Dlyio_rdenr for input to configurable delay chain 1204D. The amount of delay through the configurable delay chain 1204C is determined by the value of Config_dlyio_rdenr<3:0>. The output of the configurable delay chain 1204D (Dlyio_rdckr) is input to buffer 1210E to form Dlyio_rdenf. The amount of delay through the configurable delay chain 1204D is determined by the value of Config_dlyio_rdck<3:0>.

Figure 13:
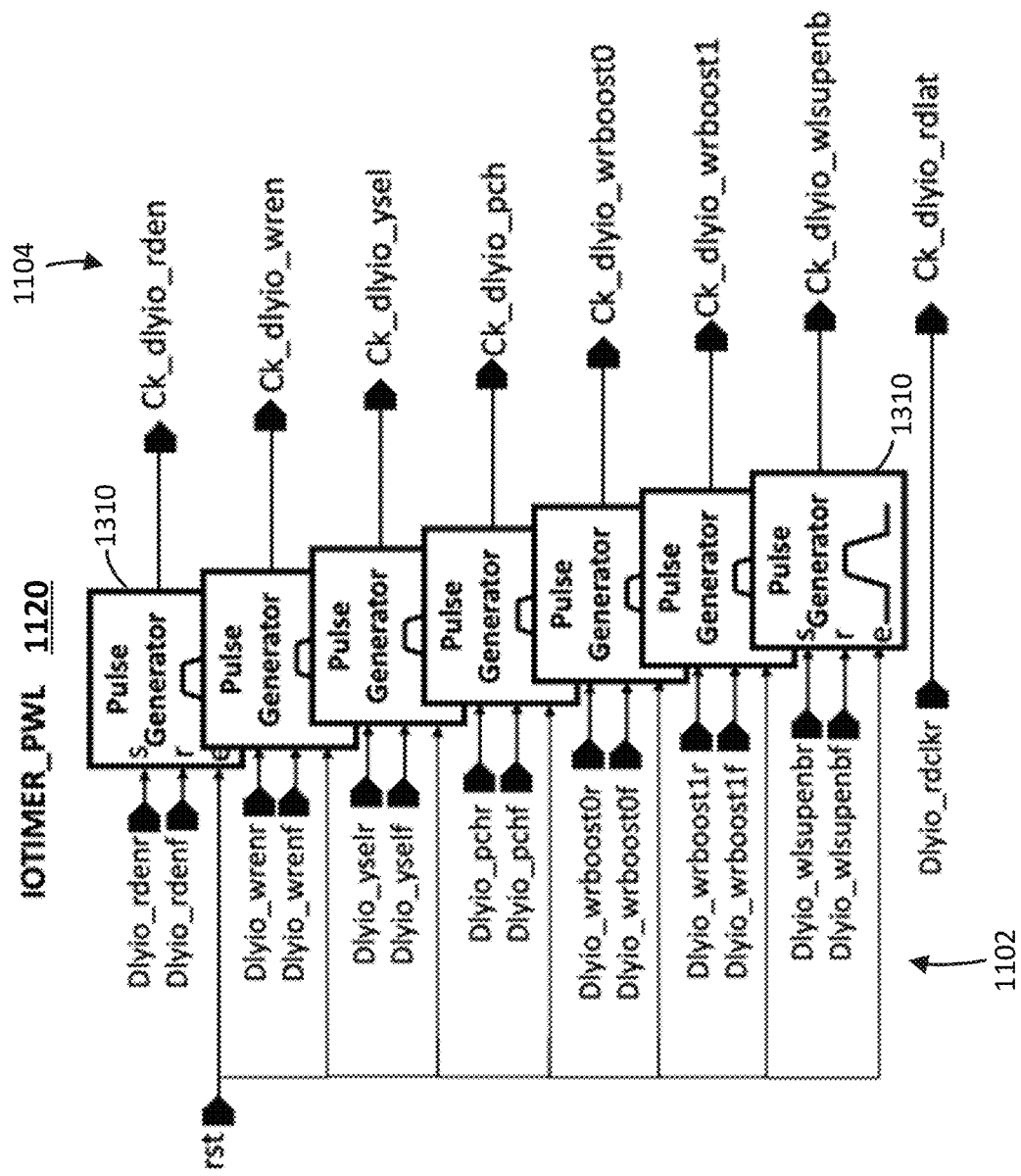
FIG. 13 shows an example implementation of a pulse generation unit in an IO timer, according to some embodiments.

FIG. 13 shows an example implementation of the pulse generation unit 1120, according to some embodiments. The pulse generation unit 1120 can be implemented in a similar manner to the pulse generation unit 620 of the RAS timer, using a set of pulse generators 1310. The pulse generators 1310 may be identical to the pulse generators 910 (e.g., implemented in accordance with FIG. 9B). Each pulse generator 1310 produces a corresponding one of the clock signals 1104 at its output port based on signals received at three input ports: set (s), reset (r), and enable/external reset (e).

Each set port s of a pulse generator 1310 is connected to a corresponding one of the signals 1102 that controls the rising edge of the output of the pulse generator. Similarly, each reset port r of the pulse generator 1310 is connected to a corresponding one of the signals 1102 that controls the falling edge of the output of the pulse generator. Each enable port e of a pulse generator 1310 is connected to the same external reset signal (e.g., Rst in FIG. 5). Unlike other ones of the clock signals 1104, the clock signal Ck_dlyio_rdlat is not produced by a pulse generator 1130 but instead corresponds to Dlyio_rdclkr, which is essentially a delayed version of Ckio and is used to drive the clock inputs of read latches (e.g., latches within the memory interface 410) to store read data.

Figure 14:
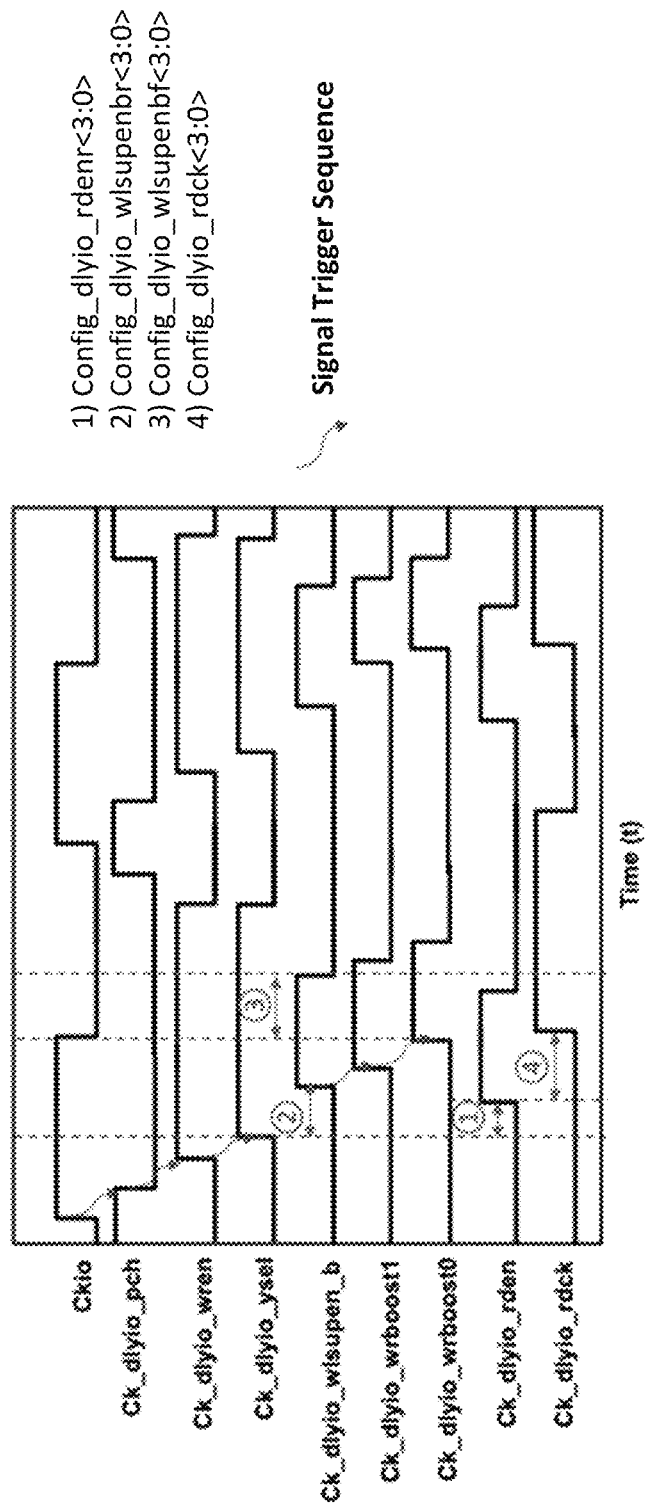
FIG. 14 shows an example timing diagram for an IO timer, according to some embodiments.

FIG. 14 shows an example timing diagram for the IO timer 422, according to some embodiments. The timing diagram in FIG. 14 is annotated to indicate a signal trigger sequence in which output clock signals are triggered in a specific order and with a predetermined timing relative to the rising edge of a pulse in the Ckio signal. The timing diagrams for the RAS timer in FIGS. 10A to 10D have not been similarly annotated. However, signal trigger sequences are also present in FIGS. 10A to 10D, where clock signals generated by the RAS timer are triggered in a specific order and with a predetermined timing relative to the rising edge of a pulse in the Clk signal. In the case of the RAS timer, this is true even for multi-cycle RAS operation. For example, in the two cycle RAS operation shown in FIG. 10A, the clock signals generated by the RAS timer are triggered relative to the rising edge of the first (leftmost) pulse in Clk.

Similar to the clock signals generated by the RAS timer, the clock signals generated by the IO timer are controlled according to the values of corresponding configuration signals. The values of the configuration signals are omitted from FIG. 14. However, the configuration signal associated with each configurable step in the signal trigger sequence is indicated. Configuration signals for both the RAS timer and the IO timer can be used to configure the delay between the rising edges of two generated clocks (e.g., configurable steps 1, 2, and 4 in FIG. 14) or to configure the duration of a single clock pulse (e.g., configurable step 3 in FIG. 14).

The signal trigger sequence in FIG. 14 begins with the rising edge of a pulse in Ckio. The IO timer generates a falling edge of a corresponding pulse in Ck_dlyio_pch in response to the rising edge of Ckio. As shown in FIG. 12, this falling edge can be formed at the output of the buffer 1210A.

In turn, the rising edge of Ck_dlyio_wren is generated relative to the falling edge of Ck_dlyio_pch, and the rising edge of Ck_dlyio_ysel is generated relative to the rising edge of Ck_dlyio_wren. The relative timings of Ck_dlyio_wren and Ck_dlyio_ysel are determined by the fixed delay chains 1202A and 1202B.

In configurable step 1, Config_dlyio_rdenr<3:0> sets the delay between the rising edge of Ck_dlyio_ysel and the rising edge of Ck_dlyio_rden. The delay can be configured using the configurable delay chain 1204C.

In configurable step 2, Config_dlyio_wlsupenbr<3:0> sets the delay between the rising edge of Ck_dlyio_ysel and the rising edge of Config_dlyio_wlsupen_b. The delay can be configured using the configurable delay chain 1204A.

In configurable step 3, Config_dlyio_wlsupenbf<3:0> sets the timing of the falling edge of Ck_dlyio_wlsupen_b relative to the rising edge of Ck_dlyio_wrboost0, thereby determining the overall duration of a pulse in Ck_dlyio_wlsupen_b. The timing of this falling edge can be configured using the configurable delay chain 1204B.

In configurable step 4, Config_dlyio_rdck<3:0> sets the delay between the rising edge of Ck_dlyio_rden and the rising edge of Config_dlyio_rdck. The delay can be configured using the configurable delay chain 1204D. The signal trigger sequence is repeated with each IO clock cycle, in response to the rising edges of the pulses in Ckio.

Figure 15A:
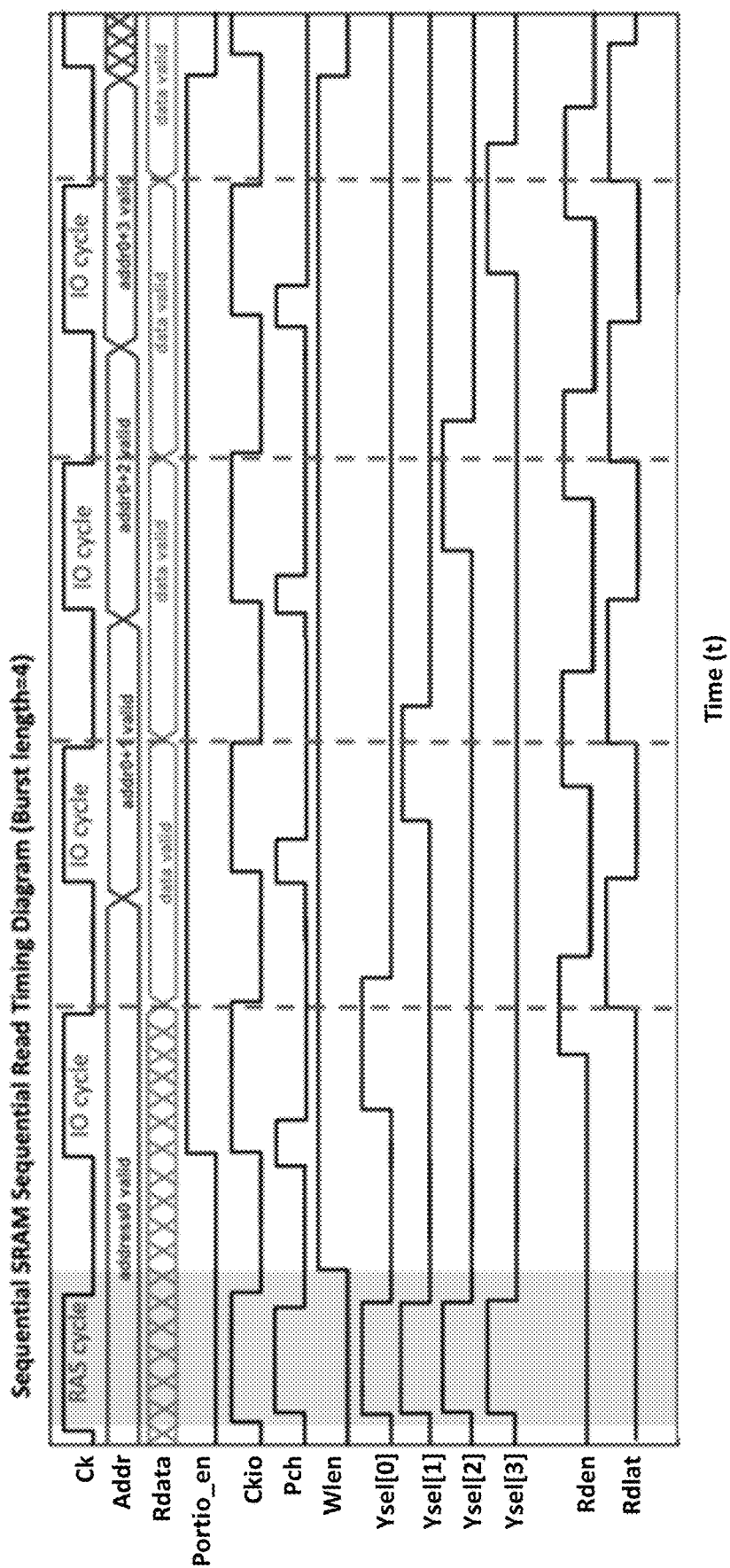
FIGS. 15A and 15B show example timing diagrams for one internal port of an SRAM controller, according to some embodiments.
Figure 15B:
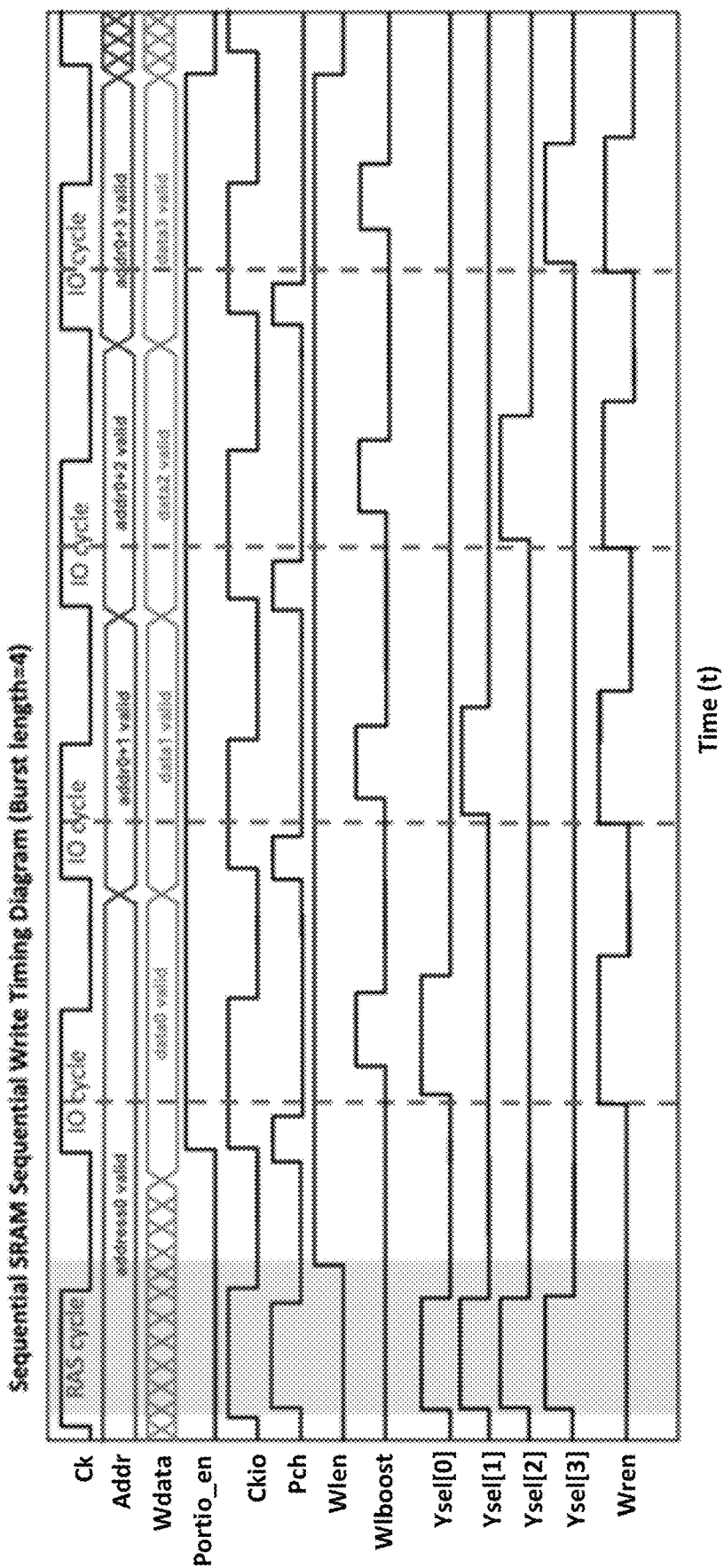

FIGS. 15A and 15B show example timing diagrams for the control logic 420, according to some embodiments. The timing diagrams in FIGS. 15A and 15B are with respect to a single internal port. Each internal port may operate with a timing similar to that depicted in FIGS. 15A and 15B. FIG. 15A shows the timing of read access with a burst length of four. FIG. 15B shows the timing of write access with a burst length of four. Both read and write burst sequences start with the RAS phase, which can involve precharging local bit lines associated with the same global column or global column range and decoding of a word line to generate the word line enable signal Wlen. As discussed above in connection with FIGS. 10A to 10D, the number of clock cycles occupied by the RAS phase is configurable. The IO phase follows the RAS phase. The number of clock cycles occupied by the IO phase equals the burst length. Accordingly, FIGS. 15A and 15B show four IO cycles.

In the sequential SRAM operation illustrated in FIGS. 15A and 15B, the row-opening overhead only occurs once, during the RAS phase, and is shared among all the sequential accesses of the local bit lines in the same global column or global column range (e.g., eight local bit lines for the bit cell array shown in FIG. 2). The word line is kept turned on during the entire duration of the sequence of burst accesses by holding Wlen high. Further, most of the precharge energy is consumed during the RAS phase (controlled by Ck_dlyras_pch0 and Ck_dlyras_pch1), with optional precharging occurring during the IO phase (controlled by Ck_dlyio_pch).

The optional precharging during the IO phase can be performed to "top up" the voltage on the local bit lines to compensate for any charge leakage that occurs after the precharge in the RAS phase. This ensures that bit lines that are accessed later in the sequence of burst accesses (e.g., the bit line associated with the fourth read or write) remain precharged to a sufficiently high voltage. Unlike precharge during the RAS phase, precharge during the IO phase can be limited to only the local bit line being accessed. IO phase precharge can be performed by the write driver associated with the global column of the bit line being accessed (e.g., write driver 210 in FIG. 2), using the column select signal ysel to select the local bit line to be precharged. The difference in precharge durations between the RAS phase and the IO phase is indicated by the pulse widths of the Pch signal, which comprises a longer pulse during the RAS phase and shorter pulses during each cycle of the IO phase. Consequently, the per access dynamic energy for read and write can be reduced, with the total dynamic energy savings increasing as the burst length increases. Depending on burst length, the energy savings can range from approximately 10% to greater than 50%, with writes generally having greater energy savings than reads.

In contrast, conventional SRAM operation involves a separate row-opening operation (including precharging and word line decoding) with each access, e.g., so that a word line enable signal is reasserted with every clock cycle, and so that precharging is performed in each clock cycle. Even when each access in the sequence of burst accesses is to the same global column (e.g., so that local columns 0, 1, 2, and 3 are selected consecutively in that order), each access would involve precharging all the local bit lines in the same global column as well as decoding of the same word line. For instance, when the burst length is four, the same word line would be decoded four times, and all eight of the local columns 205 would be precharged four times. Therefore, a significant amount of row-opening energy is wasted as a result of repeatedly precharging and decoding.

Further, it should be noted that the energy savings provided by implementing the techniques described above is not limited to accessing a set of addresses that are strictly sequential (e.g., not a fixed increment or fixed decrement, in contrast to traditional burst mode). For example, a sequence of accesses that jump back and forth across columns of the same word line (or a sequence of accesses in which the stride is non-uniform) can also benefit from having a single RAS phase to share row opening energy across the entire sequence of accesses, provided that the accesses that form the sequence of accesses are directed to the same global column or global column range.

Figure 16:
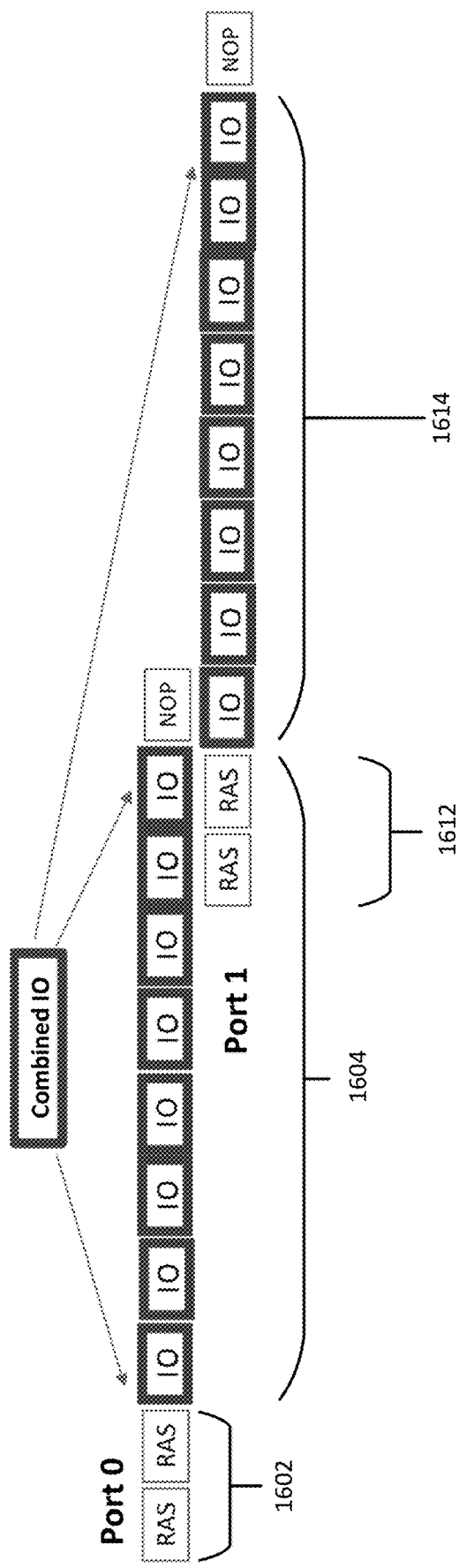
FIG. 16 shows an example of how multiple internal ports of a memory controller can be used to hide RAS latency in accordance with one or more embodiments.

FIG. 16 shows an example of how multiple internal ports of a memory controller (e.g., SRAM controller 400) can be used to hide RAS latency in accordance with one or more embodiments. In FIG. 16, a first sequence of burst accesses is performed using a first internal port (e.g., port 412A). A second sequence of burst accesses is performed using a second internal port (e.g., port 412B) and in parallel with the first sequence of burst accesses. As described above in connection with FIGS. 15A and 15B, a sequence of burst accesses can be performed using a single RAS phase spanning one or more clock cycles, followed by an IO phase spanning one or more clock cycles depending on burst length. As shown, each sequence of burst accesses includes a RAS phase, then an IO phase, and finally a no-operation (NOP) cycle. The IO cycles within a particular sequence of burst accesses involve reads or writes to the same row.

In the example of FIG. 16, the operation of the first internal port involves a two cycle RAS phase 1602 followed by an eight cycle IO phase 1604 that corresponds to eight burst accesses. Similarly, the operation of the second internal port involves a two cycle RAS phase 1612 followed by an eight cycle IO phase 1614 that corresponds to another eight burst accesses. The first internal port and the second internal port may concurrently perform burst accesses on different banks. For example, the first internal port can do a burst access of length eight on a row in Bank 0 while the second internal port does a burst access of length eight on the same or a different row number in Bank 1. The accesses performed by the first internal port can be based on an address decoded from the Addr_port0 address bus in FIG. 5.

Similarly, the accesses performed by the second internal port can be based on an address decoded from the Addr_port1 address bus.

The RAS phase 1612 of the second internal port can begin sometime after the RAS phase 1602 of the first internal port begins. In particular, the RAS phase 1612 overlaps with the IO phase 1604 of the first internal port. In some embodiments, the RAS phase of one internal port is completely overlapped by the IO phase of another port, as is the case with the RAS phase 1612. Thus, the latency associated with the operations performed during the RAS phase 1612 (e.g., precharging and word line decoding) can be completely hidden. Further, the IO phase 1614 can begin immediately after the IO phase 1604 ends so that a substantially continuous stream of data can be sent through a read or write bus (e.g., Io_wdata or Io_rdata in FIG. 5), thereby maximizing memory throughput as a result of not wasting IO cycles on RAS operations. Accordingly, operations performed by the first internal port are staggered with respect to the operations performed by the second internal port. If the memory controller includes additional internal ports, each additional internal port can likewise be configured to operate in a staggered fashion with respect to the previous internal port.

Figure 17:
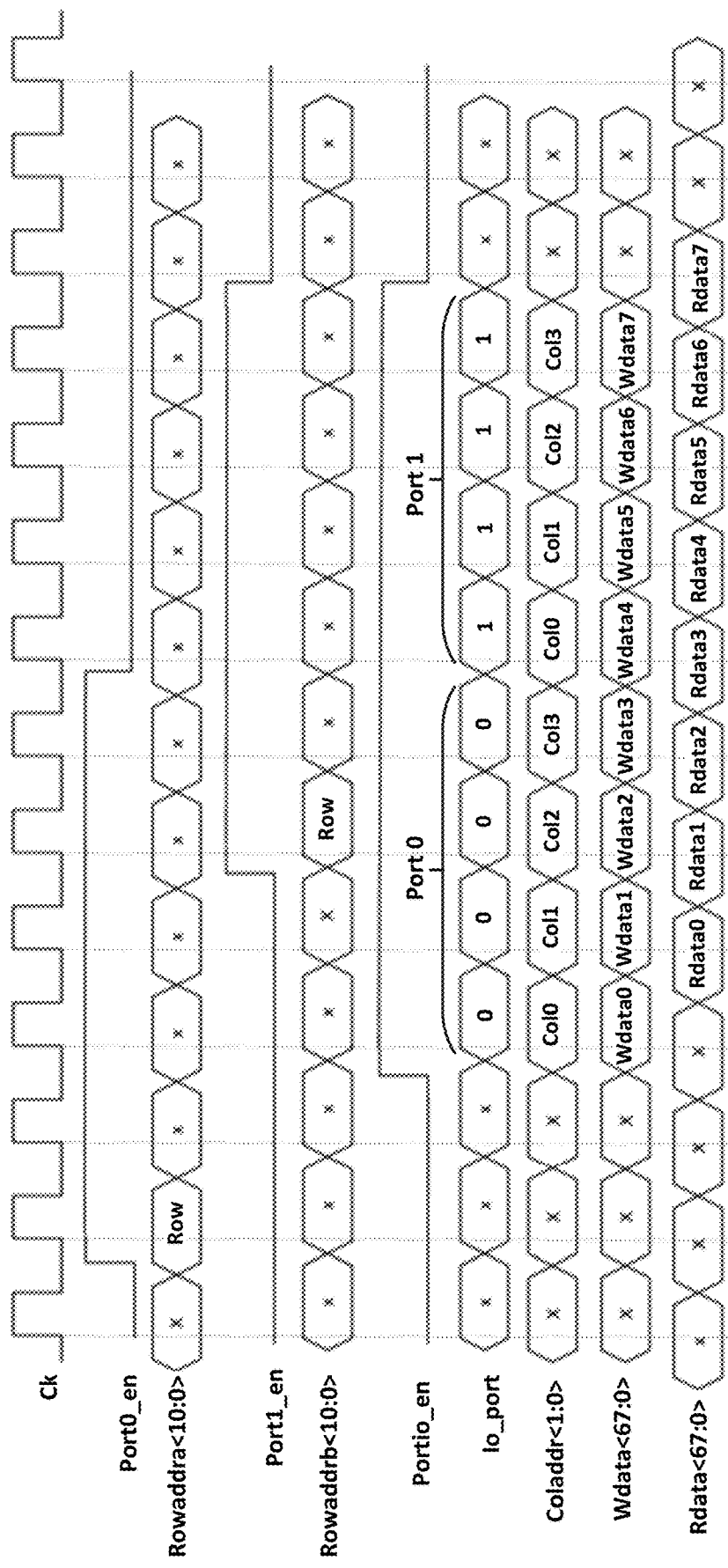
FIG. 17 shows an example timing diagram for two internal ports of an SRAM controller, according to some embodiments.

FIG. 17 shows an example timing diagram for the control logic 420, according to some embodiments. The timing diagram in FIG. 17 shows two internal ports (e.g., ports 412A and 412B) configured to perform dual-threaded access to two different rows concurrently, for example, rows in separate banks, as discussed above in reference to FIG. 16. The first internal port accesses a first row indicated by a physical row address Rowaddra<10:0>. The second internal port accesses a second row indicated by a physical row address Rowaddrb<10:0>. The first internal port accesses columns 0 to 3 of the first row, with data being driven onto a write data bus (Wdata<67:0>) or a read data bus (Rdata<67:0>). Accordingly, four sets of data (Wdata0 to Wdata3 or Rdata0 to Rdata3) are accessed, e.g., corresponding to four different addresses indicated by bits [2:0] of Addr_port0. While the first internal port is accessing columns 0 to 3 of the first row, the second internal port accesses columns 0 to 3 of the second row to begin outputting (Wdata4 to Wdata7 or Rdata4 to Rdata7) onto the same data bus as the first internal port, in tandem with the read or write data associated with the last burst access of the first internal port. Thus, the two internal ports share a single, high bandwidth data path.

Figure 18A:
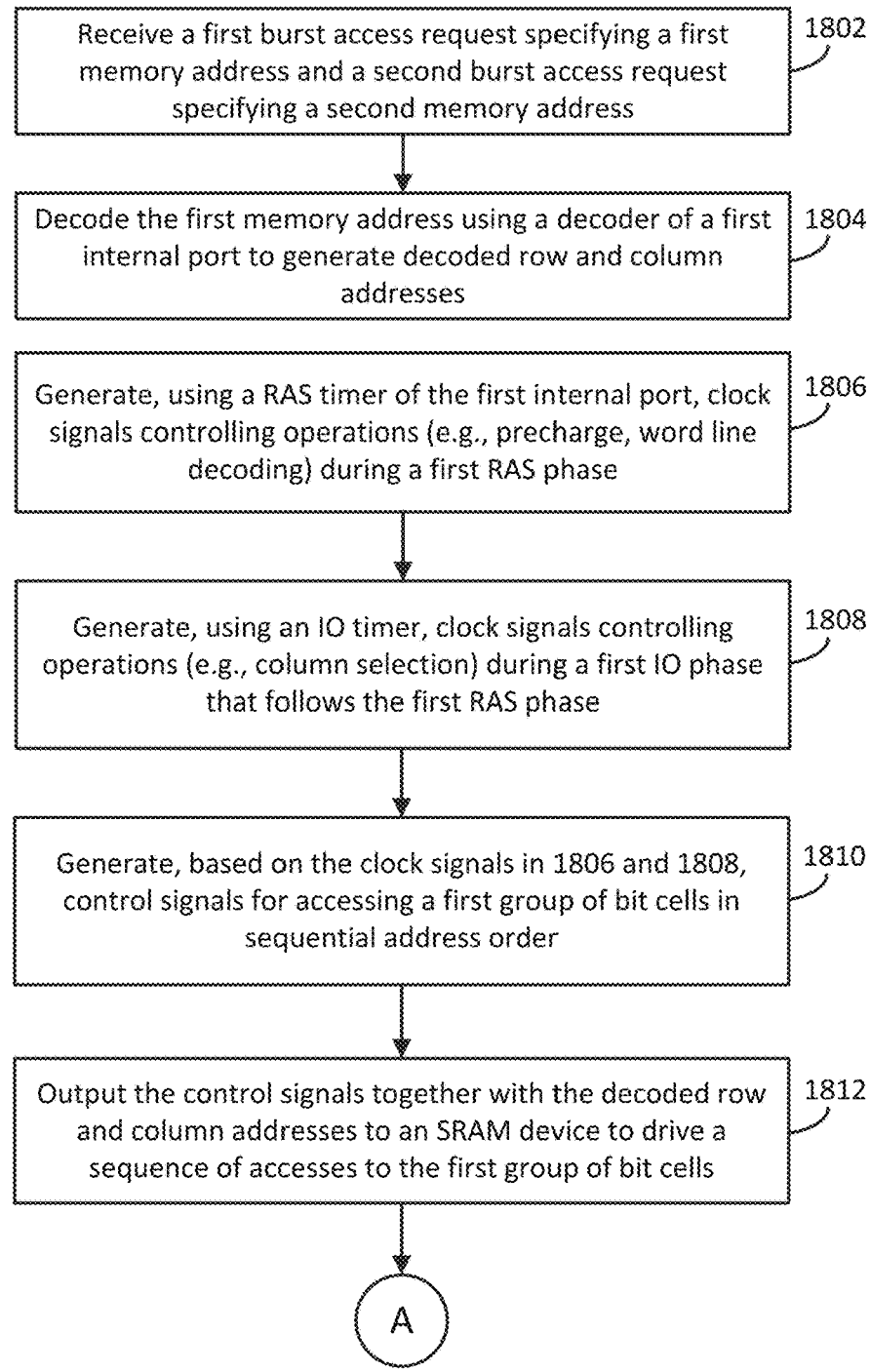
FIGS. 18A and 18B show an example of a process for performing sequential memory access, according to some embodiments.
Figure 18B:
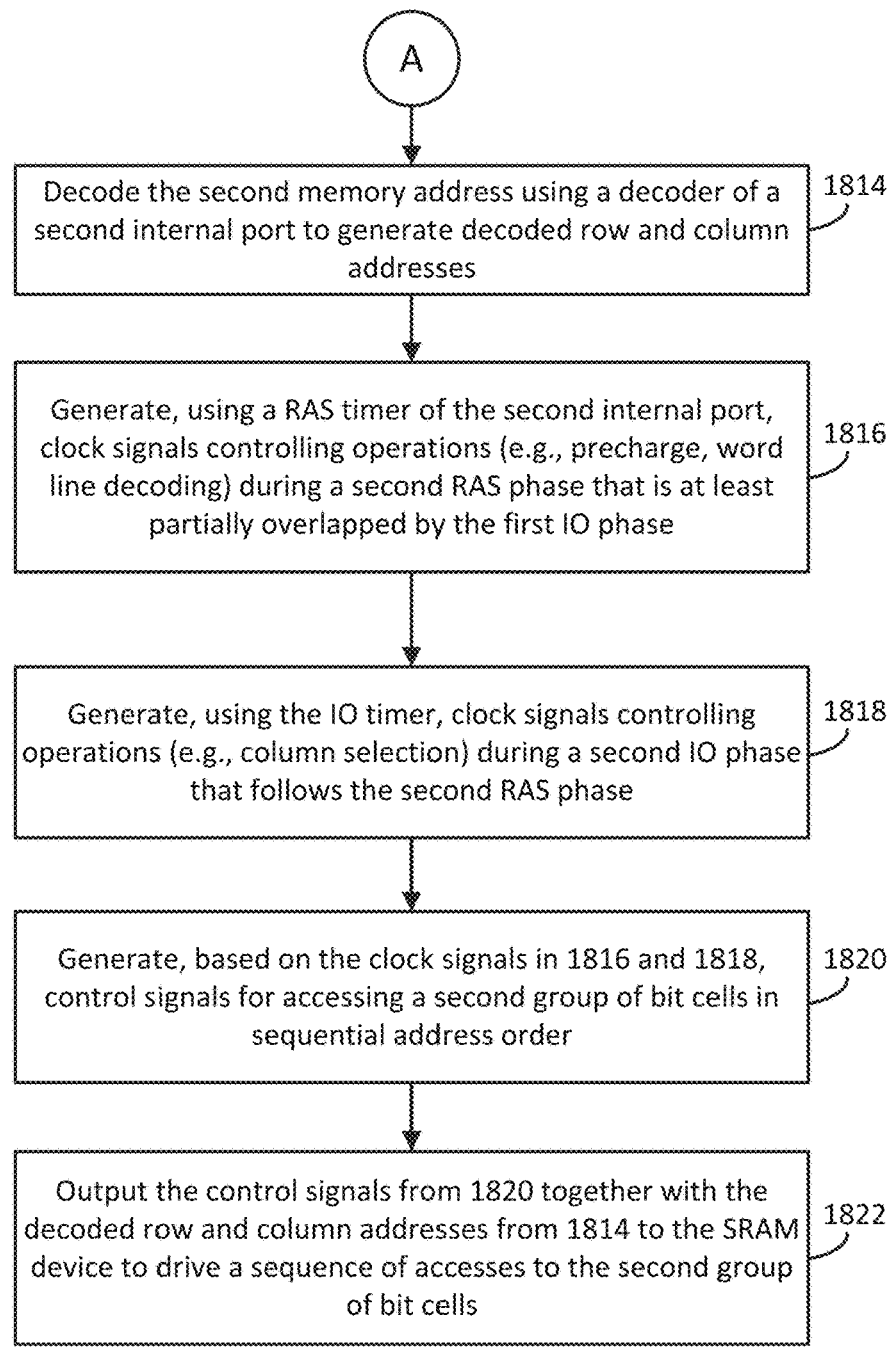

FIGS. 18A and 18B show an example of a process 1800 for performing sequential memory access, according to some embodiments. The process 1800 can be performed using the SRAM controller 400 which, as described above, can be implemented using the control logic 420 in FIG. 5. At block 1802, a first burst access and a second burst access are received. The first burst access and a second burst access specify a first memory address and a second memory address, respectively, and can be received concurrently for input to different internal ports of the controller (a first internal port and a second internal port). For example, the first memory address may correspond to an encoded address received at Addr_port0, and the second memory address may correspond to an encoded address received at Addr_port1. In some instances, the first memory address and the second memory address are specified by a requestor, e.g., the computing device 402 in FIG. 4. Additionally or alternatively, some implementations may permit the SRAM controller to generate these memory addresses without the requestor being aware that multiple internal ports are being addressed. For example, the requestor may explicitly specify both addresses in separate memory requests directed to the same port, in which case the host interface 408 can route the memory requests to different internal ports. As another example, the host interface 408 may be configured to split a memory request into separate burst accesses, for instance, based on determining that an access specified by the requestor spans multiple banks.

The first memory address and the second memory address may correspond to different addresses within an SRAM device (e.g., the memory 404) that includes multiple bit cell arrays (e.g., multiple banks 550, where each bank corresponds to a separate bit cell array). In particular, the first memory address and the second memory address can be any pair of addresses that are associated with physically separate regions of SRAM, e.g., different banks, as discussed above. Because the addressed regions are separate, RAS and IO phase operations can be performed on the addressed regions concurrently, e.g., in the staggered manner depicted in FIG. 16.

At block 1804, the first memory address is decoded using a decoder of the first internal port (e.g., decoder 510 of the port 412A) to generate decoded row and column addresses. As shown in FIG. 5, the decoded row and column addresses are output by the internal port in the form of various address signals that collectively indicate which portion of memory is being accessed (e.g., bank, array, row segment, etc.).

At block 1806, a RAS timer of the first internal port (e.g., RAS timer 414 of the port 412A) generates clock signals controlling operations during a first RAS phase (e.g., RAS phase 1602 in FIG. 16). Operations during a RAS phase can include one or more precharge operations (e.g., precharge 0 and/or precharge 1), a bit line voltage equalization operation, as well as a word line decoding operation to determine which word line of a bit cell array to assert. Thus, the first RAS timer may be configured to generate, among other things, a clock signal (e.g., Ck_dlyras_pch0 or Ck_dlyras_pch1) that controls a timing of a port-specific precharge signal (e.g., Bankport0_pch). The word line decoding in the RAS phase can be performed once for all bit cells in the first group of bit cells.

At block 1808, an IO timer of the controller (e.g., IO timer 422) generates clock signals controlling operations during a first IO phase (e.g., IO phase 1604). The first IO phase follows the first RAS phase (e.g., starting in the next clock cycle after the first RAS phase). Operations during an IO phase include reading from memory or writing to memory and may involve various sub-operations such as column selection, IO phase precharge, read latching, word line boosting, and write driver activation. Thus, the IO timer may be configured to generate, among other things, a clock signal (e.g., Ck_dlyio_ysel as an input to port 412A) that controls a timing of a port-specific column select signal (e.g., Bankport0_ysel). The port-specific column select signal can be updated multiple times during the first IO phase, each update to the port-specific column select signal causing a different bit cell in the first group of bit cells to be selected (e.g., to individually select columns 0, 1, 2, and 3 in sequential order over consecutive IO cycles, as shown in FIGS. 15A and 15B).

At block 1810, control signals are generated based on the clock signals from the RAS timer of the first internal port and the clock signals from the IO timer (i.e., the clock signals in 1806 and 1808). The control signals in 1810 are used for accessing a first group of bit cells in sequential address order. The bits cells in the first group of bit cells can be bit cells that belong to the same global column or global column range. The functionality in 1810 may be provided through control logic of the first internal port (e.g., combinational logic 520 and column control logic 530 in port 412A) working together with shared control logic such as the PortIO module 540.

At block 1812, the control signals generated in 1810 are output together with the decoded row and column addresses generated in 1804 to the SRAM device. For example, in FIG. 5, the signals 522 and 524 may be operatively coupled to each bank 550. The control signals drive a sequence of accesses to the first group of bit cells, which may reside in one of the banks 550. The read or write data for the sequence of accesses can be communicated over a data bus shared between the first internal port and the second internal port.

At block 1814, the second memory address is decoded using a decoder of the second internal port (e.g., decoder 510 of the port 412B) to generate decoded row and column addresses. The decoding in 1814 can be performed concurrently with the decoding in 1804.

At block 1816, a RAS timer of the second internal port (e.g., RAS timer 414 of the port 412B) generates clock signals controlling operations during a second RAS phase (e.g., RAS phase 1612 in FIG. 16). The second RAS phase may involve similar operations to the operations performed during the first RAS phase, but with respect to a second group of bit cells in the SRAM device. For example, when both precharge 0 and precharge 1 are performed during the first RAS phase, precharge 0 and precharge 1 may also be performed during the second RAS phase. Thus, the second RAS timer may be configured to generate a clock signal (e.g., Ck_dlyras_pch0 or Ck_dlyras_pch1) that controls a timing of a port-specific precharge signal (e.g., Bankport1_pch).

The second group of bit cells can be any group of bit cells located in a different region of the SRAM device than the first group of bit cells. For example, the second group of bit cells may belong to a global column or global column range in a different bank than the first group of bit cells.

As discussed above in reference to FIG. 16 the IO phase of a first internal port may coincide with the RAS phase of a second internal port so that the RAS latency of the second internal port is hidden. Accordingly, the second RAS phase may be at least partially overlapped by the first IO phase. In some implementations, the second RAS phase is completely overlapped so that the second RAS phase is finished by the end of the first IO phase.

At block 1818, the IO timer generates clock signals controlling operations during a second IO phase (e.g., IO phase 1614). The second IO phase follows the second RAS phase (e.g., starting in the next clock cycle after the second RAS phase). The second IO phase may involve similar operations to the operations performed during the first IO phase, but with respect to the second group of bit cells. Thus, the IO timer may be configured to generate, among other things, a clock signal (e.g., Ck_dlyio_ysel as an input to port 412B) that controls a timing of a port-specific column select signal (e.g., Bankport1_ysel).

At block 1820, control signals are generated based on the clock signals from the RAS timer of the second internal port and the clock signals from the IO timer (i.e., the clock signals in 1816 and 1818). The control signals in 1820 are used for accessing the second group of bit cells in sequential address order. The functionality in 1820 may be provided through control logic of the second internal port (e.g., combinational logic 520 and column control logic 530 in port 412B) working together with shared control logic such as the PortIO module 540.

At block 1822, the control signals generated in 1820 are output together with the decoded row and column addresses generated in 1814 to the SRAM device. The control signals from block 1820 drive a sequence of accesses to the second group of bit cells. The read or write data for the sequence of accesses to the second group of bit cells can be communicated over the shared data bus.

The embodiments described herein may be used in conjunction with various technologies, such as an artificial reality system. An artificial reality system, such as a head-mounted display (TIMID) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using a light emitting diode (LED) based display subsystem.

In some embodiments, the systems, devices, and/or components (e.g., integrated circuits or integrated circuit packages) described herein may be integrated into an HMD. For example, such an HMD may include one or more light emitters and/or one or more light sensors incorporated into a portion of a frame of the HMD such that light can be emitted toward a tissue of a wearer of the HMD that is proximate to or touching the portion of the frame of the HMD. Example locations of such a portion of a frame of an HMD may include a portion configured to be proximate to an ear of the wearer (e.g., proximate to a superior tragus, proximate to a superior auricular, proximate to a posterior auricular, proximate to an inferior auricular, or the like), proximate to a forehead of the wearer, or the like. It should be noted that multiple sets of light emitters and light sensors may be incorporated into a frame of an HMD such that PPG can be determined from measurements associated with multiple body locations of a wearer of the HMD.

In the present description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

Embodiments disclosed herein may be used to implement components of an artificial reality system or may be implemented in conjunction with an artificial reality system.

Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments may be described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto. Thus, although specific embodiments have been described, these are not intended to be limiting. Various modifications and equivalents are within the scope of the following claims.

What is claimed is:

1. A static random access memory (SRAM) controller, comprising:
a host interface configured to:
provide a port through which one or more memory requests are received from a computing device external to the SRAM controller, each memory request specifying a corresponding memory address for a read or write access to an SRAM device external to the SRAM controller, and
generate a set of burst accesses based on the one or more memory requests, the set of burst accesses comprising encoded addresses for input to a plurality of internal ports of the SRAM controller in parallel;
first control logic configured to generate a first plurality of control signals for output to [an] the SRAM device through a memory interface communicatively coupling the SRAM device to the SRAM controller, wherein the first plurality of control signals causes a first group of bit cells in the SRAM device to be accessed in sequential address order, and wherein the first plurality of control signals includes a first decoded row address, a first precharge signal, and a first column select signal;
a first row address strobe (RAS) timer configured to generate a clock signal controlling a timing of the first precharge signal, wherein the first precharge signal triggers a precharge operation during a first RAS phase in which the first control logic performs a word line decoding operation once for all bit cells in the first group of bit cells to output the first decoded row address; and
an input/output (IO) timer configured to generate a clock signal controlling a timing of the first column select signal, wherein the first column select signal is updated multiple times during a first IO phase that follows the first RAS phase, each update to the first column select signal causing a different bit cell in the first group of bit cells to be selected.

2. The SRAM controller of claim 1, wherein:
the SRAM device comprises a plurality of bit cell arrays, each bit cell array including bit cells arranged into a plurality of rows and a plurality of columns, each row being associated with a corresponding word line, and each column being associated with a corresponding pair of local bit lines,
local bit lines within a bit cell array are grouped into global columns,
each bit cell in the first group of bit cells belongs to a same global column or global column range, and
the precharge operation comprises precharging local bit lines of all bit cells in the first group of bit cells.

3. The SRAM controller of claim 1, further comprising:
second control logic configured to generate a second plurality of control signals for output to the SRAM device, wherein the second plurality of control signals causes a second group of bit cells in the SRAM device to be accessed in sequential address order, and wherein the second plurality of control signals includes a second decoded row address, a second precharge signal, and a second column select signal; and
a second RAS timer configured to generate a clock signal controlling a timing of the second precharge signal, wherein:
the second precharge signal triggers a precharge operation during a second RAS phase in which the second control logic performs a word line decoding operation once for all bit cells in the second group of bit cells to output the second decoded row address,
the first control logic and the first RAS timer are associated with a first internal port of the plurality of internal ports,
the second control logic and the second RAS timer are associated with a second internal port of the plurality of internal ports,
the IO timer is shared by the plurality of internal ports,
the set of burst accesses comprises a first sequence of burst accesses for the first internal port and a second sequence of burst accesses for the second internal port,
the first sequence of bursts accesses involves reads or writes to a first row in the SRAM device, and
the second sequence of burst accesses involves reads or writes to a second row in the SRAM device.

4. The SRAM controller of claim 3, wherein:
bit cells in the second group of bit cells are accessed in sequential address order during a second IO phase that follows the second RAS phase, and
the second RAS phase is at least partially overlapped by the first IO phase.

5. The SRAM controller of claim 4, further comprising:
a data bus onto which read or write data is communicated during the first IO phase and the second IO phase, wherein the data bus is shared by the plurality of internal ports.

6. The SRAM controller of claim 3, wherein the second group of bit cells belongs to a different bit cell array than the first group of bit cells.

7. The SRAM controller of claim 1, wherein:
the first RAS timer includes a first set of delay elements that are connected in sequence to control a relative timing between two or more clock signals generated by the first RAS timer, wherein each delay element in the first set of delay elements is used to generate a corresponding clock signal for the first RAS timer, and wherein the first set of delay elements includes a configurable delay element that is used to generate the clock signal controlling the timing of the first precharge signal; or the IO timer includes a second set of delay elements that are connected in sequence to control a relative timing between two or more clock signals generated by the IO timer, wherein each delay element in the second set of delay elements is used to generate a corresponding clock signal for the IO timer, and wherein the second set of delay elements includes a configurable delay element that is used to generate the clock signal controlling the timing of the first column select signal.

8. The SRAM controller of claim 7, wherein the two or more clock signals generated by the first RAS timer or the two or more clock signals generated by the IO timer are triggered in sequence based on a single pulse in an input clock of the SRAM controller.

9. The SRAM controller of claim 1, wherein the first RAS timer is configurable such that a duration of the first RAS phase can be set to more than one cycle of an input clock to the SRAM controller.

10. A system, comprising:
a static random access memory (SRAM) device including a plurality of bit cell arrays, each bit cell array including bit cells arranged into a plurality of rows and a plurality of columns, each row being associated with a corresponding word line, and each column being associated with a corresponding pair of local bit lines, wherein local bit lines within a bit cell array are grouped into global columns; and
an SRAM controller including:
a memory interface communicatively coupling the SRAM device to the SRAM controller;
a host interface configured to:
provide a port through which one or more memory requests are received from a computing device external to the SRAM controller, each memory request specifying a corresponding memory address for a read or write access to the SRAM device, and
generate a set of burst accesses based on the one or more memory requests, the set of burst accesses comprising encoded addresses for input to a plurality of internal ports of the SRAM controller in parallel;
first control logic configured to generate a first plurality of control signals for output to the SRAM device through the memory interface, wherein the first plurality of control signals causes a first group of bit cells in the SRAM device to be accessed in sequential address order, and wherein the first plurality of control signals includes a first decoded row address, a first precharge signal, and a first column select signal;
a first row address strobe (RAS) timer configured to generate a clock signal controlling a timing of the first precharge signal, wherein the first precharge signal triggers a precharge operation during a first RAS phase in which the first control logic performs a word line decoding operation once for all bit cells in the first group of bit cells to output the first decoded row address; and
an input/output (IO) timer configured to generate a clock signal controlling a timing of the first column select signal, wherein the first column select signal is updated multiple times during a first IO phase that follows the first RAS phase, each update to the first column select signal causing a different bit cell in the first group of bit cells to be selected.

11. The system of claim 10, wherein each bit cell in the first group of bit cells belongs to a same global column or global column range, and wherein the precharge operation comprises precharging local bit lines of all bit cells in the first group of bit cells.

12. The system of claim 10, further comprising:
second control logic configured to generate a second plurality of control signals for output to the SRAM device, wherein the second plurality of control signals causes a second group of bit cells in the SRAM device to be accessed in sequential address order, and wherein the second plurality of control signals includes a second decoded row address, a second precharge signal, and a second column select signal; and
a second RAS timer configured to generate a clock signal controlling a timing of the second precharge signal, wherein:
the second precharge signal triggers a precharge operation during a second RAS phase in which the second control logic performs a word line decoding operation once for all bit cells in the second group of bit cells to output the second decoded row address,
the first control logic and the first RAS timer are associated with a first internal port of the plurality of internal ports,
the second control logic and the second RAS timer are associated with a second internal port of the plurality of internal ports,
the IO timer is shared by the plurality of internal ports,
the set of burst accesses comprises a first sequence of burst accesses for the first internal port and a second sequence of burst accesses for the second internal port,
the first sequence of bursts accesses involves reads or writes to a first row in the SRAM device, and
the second sequence of burst accesses involves reads or writes to a second row in the SRAM device.

13. The system of claim 12, wherein:
bit cells in the second group of bit cells are accessed in sequential address order during a second IO phase that follows the second RAS phase, and
the second RAS phase is at least partially overlapped by the first IO phase.

14. The system of claim 13, wherein the SRAM controller further includes a shared data bus onto which read or write data is communicated during the first IO phase and the second IO phase.

15. The system of claim 10, wherein:
the first RAS timer includes a first set of delay elements that are connected in sequence to control a relative timing between two or more clock signals generated by the first RAS timer, wherein each delay element in the first set of delay elements is used to generate a corresponding clock signal for the first RAS timer, and wherein the first set of delay elements includes a configurable delay element that is used to generate the clock signal controlling the timing of the first precharge signal; or the IO timer includes a second set of delay elements that are connected in sequence to control a relative timing between two or more clock signals generated by the IO timer, wherein each delay element in the second set of delay elements is used to generate a corresponding clock signal for the IO timer, and wherein the second set of delay elements includes a configurable delay element that is used to generate the clock signal controlling the timing of the first column select signal.

16. The system of claim 15, wherein the two or more clock signals generated by the first RAS timer or the two or more clock signals generated by the IO timer are triggered in sequence based on a single pulse in an input clock of the SRAM controller.

17. A method, comprising:
receiving, through a port provided by a host interface of a static random access memory (SRAM) controller, one or more memory requests from a computing device external to the SRAM controller, each memory request specifying a corresponding memory address for a read or write access to an SRAM device external to the SRAM controller;
generating, by the SRAM controller, a set of burst accesses based on the one or more memory requests, the set of burst accesses comprising encoded addresses for input to a plurality of internal ports of the SRAM controller in parallel;
generating, by a first control logic of the SRAM controller, a first plurality of control signals for output to an SRAM device through a memory interface communicatively coupling the SRAM device to the SRAM controller, wherein the first plurality of control signals causes a first group of bit cells in the SRAM device to be accessed in sequential address order, and wherein the first plurality of control signals includes a first decoded row address, a first precharge signal, and a first column select signal;
generating, by a first row address strobe (RAS) timer of the SRAM controller, a clock signal controlling a timing of the first precharge signal, wherein the first precharge signal triggers a precharge operation during a first RAS phase in which the first control logic performs a word line decoding operation once for all bit cells in the first group of bit cells to output the first decoded row address; and
generating, by an IO timer of the SRAM controller, a clock signal controlling a timing of the first column select signal, wherein the first column select signal is updated multiple times during a first IO phase that follows the first RAS phase, each update to the first column select signal causing a different bit cell in the first group of bit cells to be selected.

18. The method of claim 17, wherein:
the SRAM device comprises a plurality of bit cell arrays, each bit cell array including bit cells arranged into a plurality of rows and a plurality of columns, each row being associated with a corresponding word line, and each column being associated with a corresponding pair of local bit lines,
local bit lines within a bit cell array are grouped into global columns,
each bit cell in the first group of bit cells belongs to a same global column or global column range, and
the precharge operation comprises precharging local bit lines of all bit cells in the first group of bit cells.

19. The method of claim 17, further comprising:
generating, by a second control logic of the SRAM controller, a second plurality of control signals for output to the SRAM device, wherein the second plurality of control signals causes a second group of bit cells in the SRAM device to be accessed in sequential address order, and wherein the second plurality of control signals includes a second decoded row address, a second precharge signal, and a second column select signal; and
controlling, by a second RAS timer of the SRAM controller, a timing of the second precharge signal, wherein:
the second precharge signal triggers a precharge operation during a second RAS phase in which the second control logic performs a word line decoding operation once for all bit cells in the second group of bit cells to output the second decoded row address,
the first control logic and the first RAS timer are associated with a first internal port of the plurality of internal ports,
the second control logic and the second RAS timer are associated with a second internal port of the plurality of internal ports,
the IO timer is shared by the plurality of internal ports,
the set of burst accesses comprises a first sequence of burst accesses for the first internal port and a second sequence of burst accesses for the second internal port,
the first sequence of bursts accesses involves reads or writes to a first row in the SRAM device, and
the second sequence of burst accesses involves reads or writes to a second row in the SRAM device.

20. The method of claim 19, wherein:
bit cells in the second group of bit cells are accessed in sequential address order during a second IO phase that follows the second RAS phase, and
the second RAS phase is at least partially overlapped by the first IO phase.

* * * * *